US012610586B2

(12) United States Patent
Shih et al.

(10) Patent No.: US 12,610,586 B2
(45) Date of Patent: Apr. 21, 2026

(54) SEMICONDUCTOR DEVICE AND METHOD FOR THERMAL DISSIPATION

(71) Applicant: TAIWAN SEMICONDUCTOR MANUFACTURING COMPANY, LTD., Hsinchu (TW)

(72) Inventors: Che Chi Shih, Taoyuan (TW); Jhih-Rong Huang, Hsinchu County (TW); Han-Yu Lin, Nantou County (TW); Ku-Feng Yang, Hsinchu County (TW); Wei-Yen Woon, Taoyuan (TW); Szuya Liao, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 469 days.

(21) Appl. No.: 18/354,513

(22) Filed: Jul. 18, 2023

(65) Prior Publication Data

US 2025/0031413 A1      Jan. 23, 2025

(51) Int. Cl.
H10D 30/67 (2025.01)
H01L 23/373 (2006.01)
(Continued)

(52) U.S. Cl.
CPC ..... H10D 30/6735 (2025.01); H01L 23/3732 (2013.01); H01L 23/3735 (2013.01); H10D 30/014 (2025.01); H10D 30/43 (2025.01); H10D 30/6757 (2025.01); H10D 62/121 (2025.01); H10D 64/017 (2025.01); H10D 84/0167 (2025.01); H10D 84/017 (2025.01); H10D 84/0186 (2025.01); H10D 84/038 (2025.01); H10D 84/85 (2025.01)

(58) Field of Classification Search
CPC .... H10D 30/014; H10D 30/43; H10D 62/121; H10D 84/0167; H10D 84/017; H10D 84/0186; H10D 84/038; H10D 84/85; H10D 30/019; H10D 30/501; H10D 84/0188; H10D 84/0151; H10D 88/00; H10D 88/01; H10D 84/851; H10D 84/832; B82Y 10/00
See application file for complete search history.

(56) References Cited

U.S. PATENT DOCUMENTS 9,209,247 B2    12/2015    Colinge et al.
9,236,267 B2    1/2016    De et al.
(Continued)

FOREIGN PATENT DOCUMENTS

CN        116314195 A        6/2023
TW        202324511 A        6/2023
WO        2022245889 A1        11/2022

*Primary Examiner* — Fernando L Toledo
*Assistant Examiner* — Adam S Bowen
(74) *Attorney, Agent, or Firm* — Maschoff Brennan

(57) ABSTRACT

Method to implement heat dissipation multilayer and reduce thermal boundary resistance for high power consumption semiconductor devices is provided. The heat dissipation multilayer comprises a first crystalline layer that possesses a first phonon frequency range, a second crystalline layer that has a second phonon frequency range which does not overlap with the first phonon frequency range, and an amorphous layer located between the first and second crystalline layers. The amorphous layer has a third phonon frequency range that overlaps both the first and second phonon frequency ranges.

20 Claims, 23 Drawing Sheets

(51) Int. Cl.

| | |
|---|---|
| *H10D 30/01* | (2025.01) |
| *H10D 30/43* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2023/0197569 A1* | 6/2023 | Dewey ................... | H10D 84/85 257/401 |
| 2023/0197800 A1 | 6/2023 | Dewey et al. | |

* cited by examiner

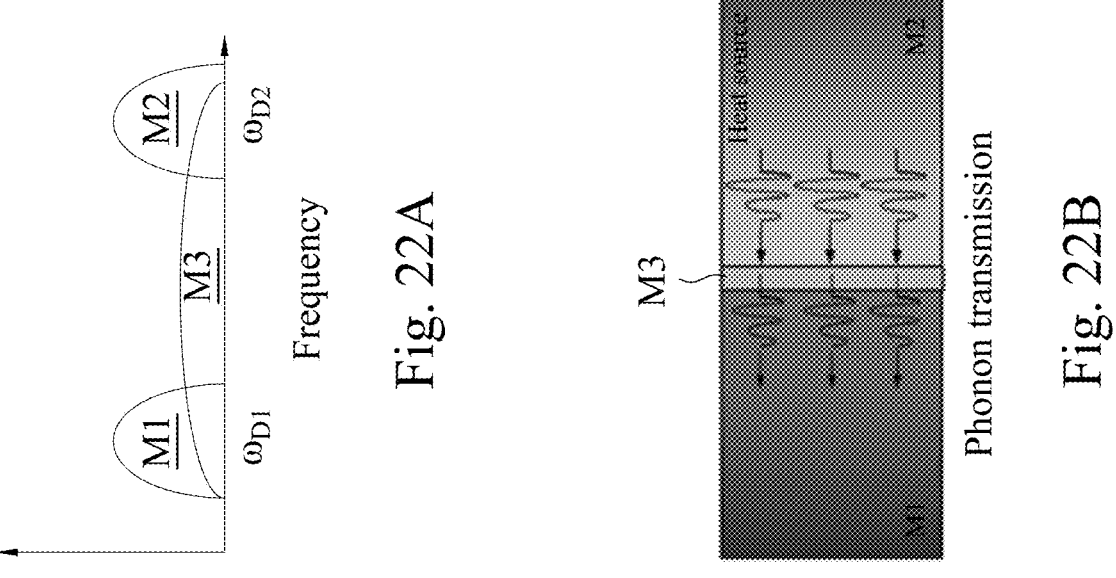
Fig. 21A
Fig. 22A
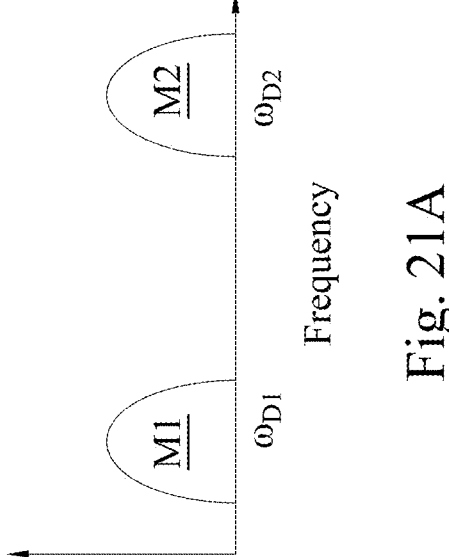
Phonon reflection
Fig. 21B
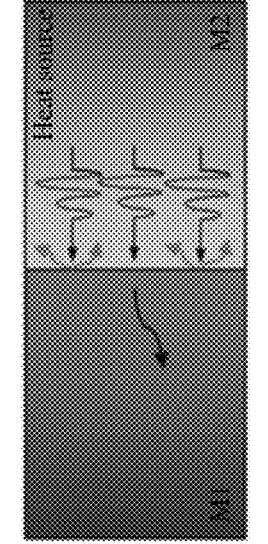
Phonon transmission
Fig. 22B

SEMICONDUCTOR DEVICE AND METHOD FOR THERMAL DISSIPATION

BACKGROUND

As the semiconductor industry further progresses into sub-10 nanometer (nm) technology process nodes in pursuit of higher device density, higher performance, and lower costs, challenges from both fabrication and design issues have led to stacked device structure configurations, such as complementary field effect transistors (C-FET) where an n-type multi-gate transistor and a p-type multi-gate transistor are stacked vertically, one over the other. While existing C-FET structures are generally adequate, they are not satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 21A and 21B are schematic views of heat dissipation in accordance with some embodiments of the present disclosure.

FIGS. 22A and 22B are schematic views of heat dissipation in accordance with some embodiments of the present disclosure.

DETAILED DESCRIPTION

Figure 1:
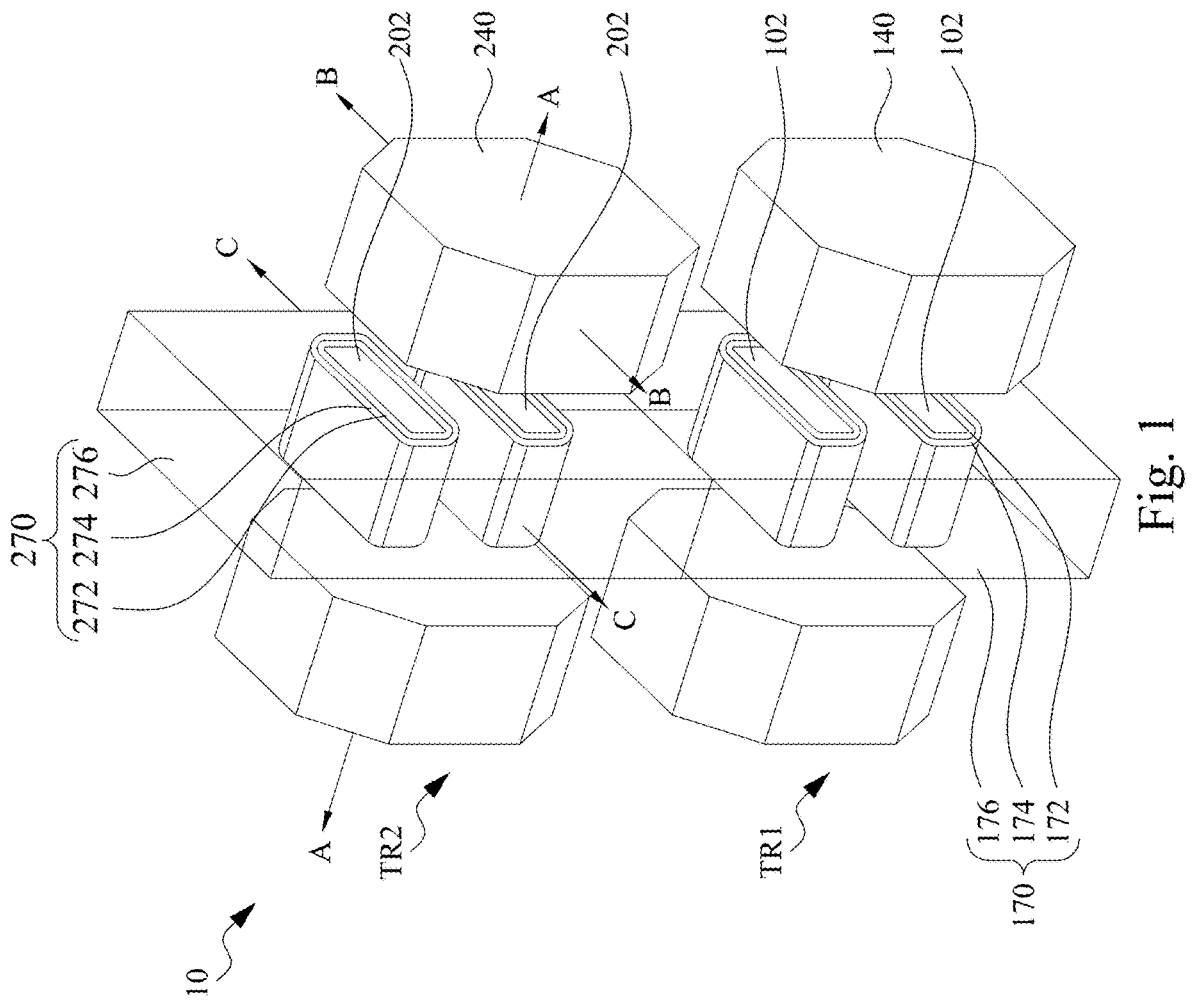
FIG. 1 is a perspective view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 is a perspective view of a semiconductor device in accordance with some embodiments of the present disclosure. In the present disclosure, a complementary FET (CFET) 10 is provided, and its manufacturing method will be disclosed in the following discussion. In a CFET 10, a first transistor TR1 is disposed over a substrate (not shown), and a second transistor TR2 is disposed vertically above the first transistor TR1. In some embodiments, the first transistor TR1 and the second transistor TR2 may be field effect transistor (FET) and may both include gate-all-around (GAA) configuration, and thus the first transistor TR1 and the second transistor TR2 can also be referred to as GAA FET. The first transistor TR1 includes first semiconductor channel layers 102 vertically stacked one above another, a first metal gate structure 170 wrapping around each of the first semiconductor channel layers 102, and first source/drain epitaxy structures 140 on opposite ends of each of the first semiconductor channel layers 102. Similarly, the second transistor TR2 includes second semiconductor channel layers 202 vertically stacked one above another, a second metal gate structure 270 wrapping around each of the second semiconductor channel layers 202, and second source/drain epitaxy structures 240 on opposite ends of each of the second semiconductor channel layers 202. The first metal gate structure 170 may include an interfacial layer 172, a gate dielectric layer 174, and a gate electrode 176. Similarly, the second metal gate structure 270 may include an interfacial layer 272, a gate dielectric layer 274, and a gate electrode 276. In some embodiments, the first transistor TR1 has a first conductivity type (e.g., p-type) and the second transistor TR2 has a second conductivity type (e.g., n-type) different from the first conductivity type. In some embodiments, the first transistor TR1 can be referred to as a P-FET, and the second transistor TR2 can be referred to as an N-FET.

For a CFET device, heat dissipation becomes important, and high-kappa material is commonly used in a stacked device such as CFET. However, traditional high-kappa material may suffer from high thermal boundary resistance between interfaces of different high-kappa materials due to phonon frequency mismatch. To address this issue, embodiments of the present disclosure provide a heat dissipation multilayer, which includes a first high-kappa layer and a second high-kappa layer. The heat dissipation multilayer may also include a dielectric layer between the first high-kappa layer and the second high-kappa layer. The dielectric layer may act as a bridging layer between the first high-kappa layer and the second high-kappa layer, so as to reduce the thermal boundary resistance between the first high-kappa layer and the second high-kappa layer. Accordingly, the heat dissipation of the device may be improved.

Figure 6B:
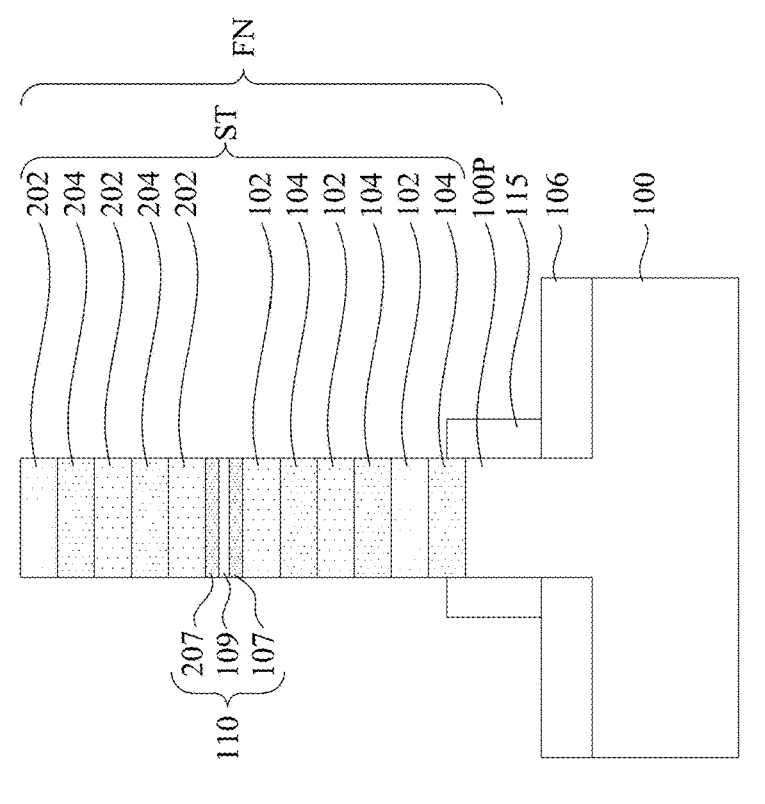
Figure 6A:
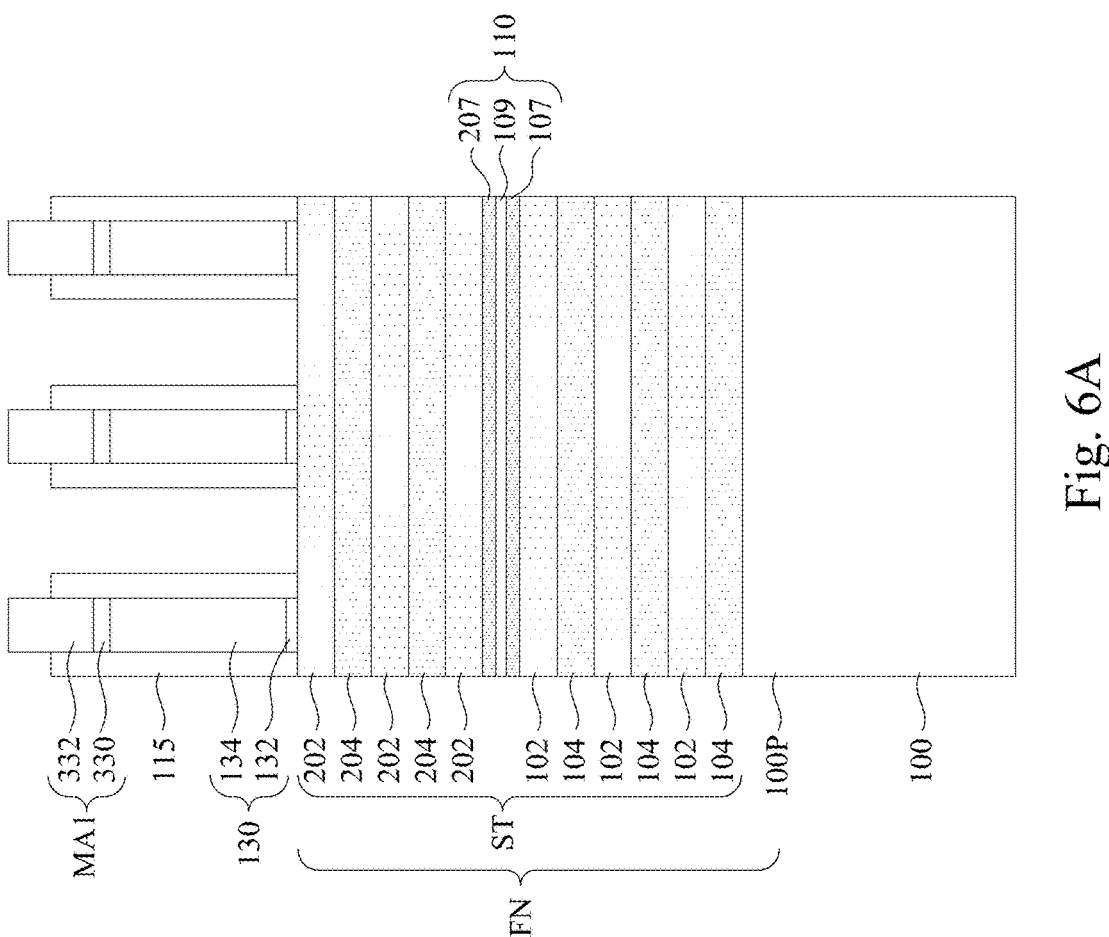
Figures 7A, 7B:
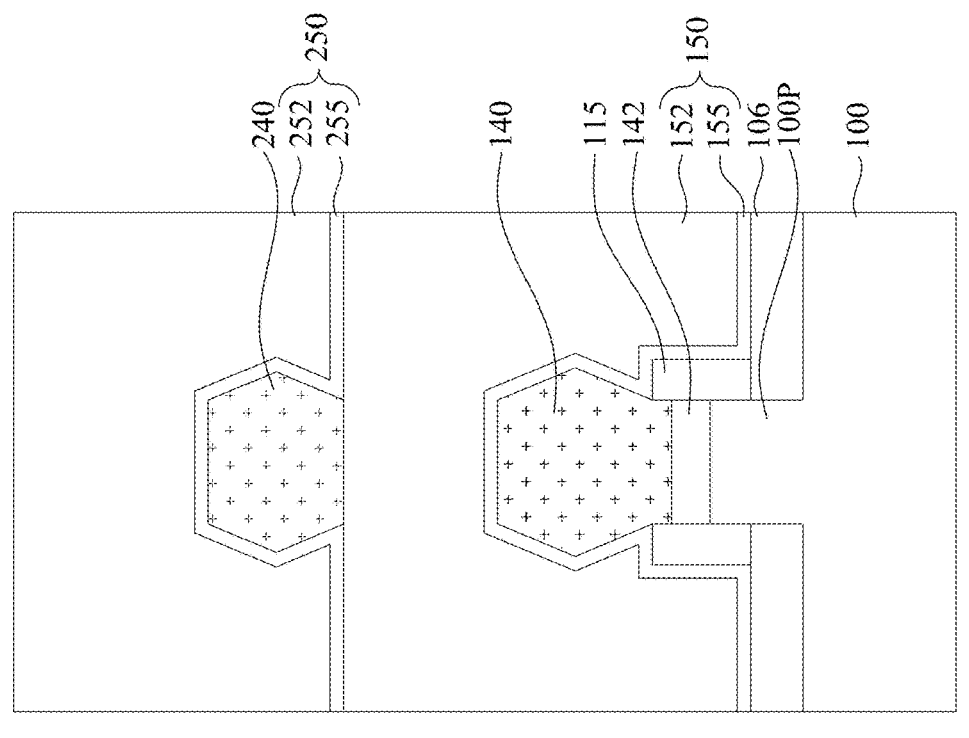
Figure 8A:
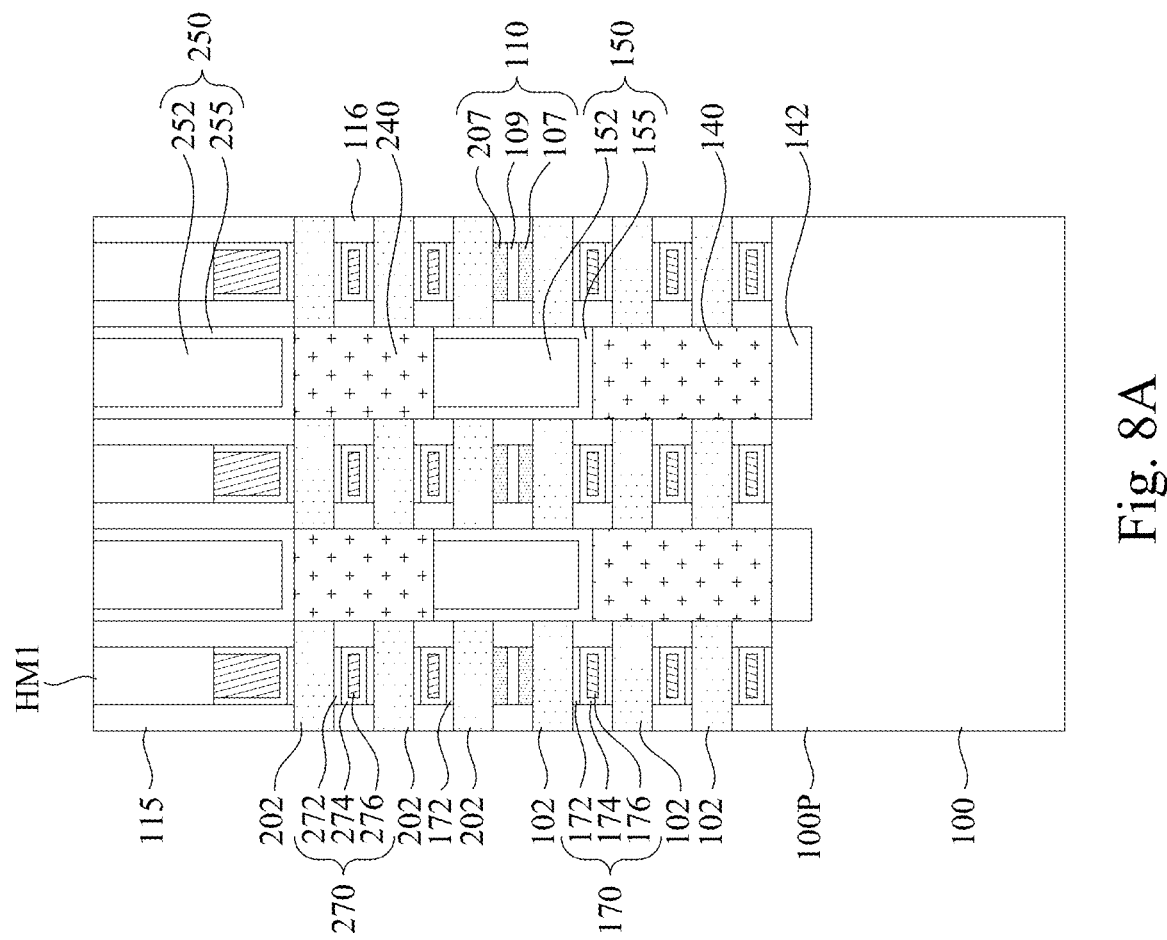
Figure 8B:
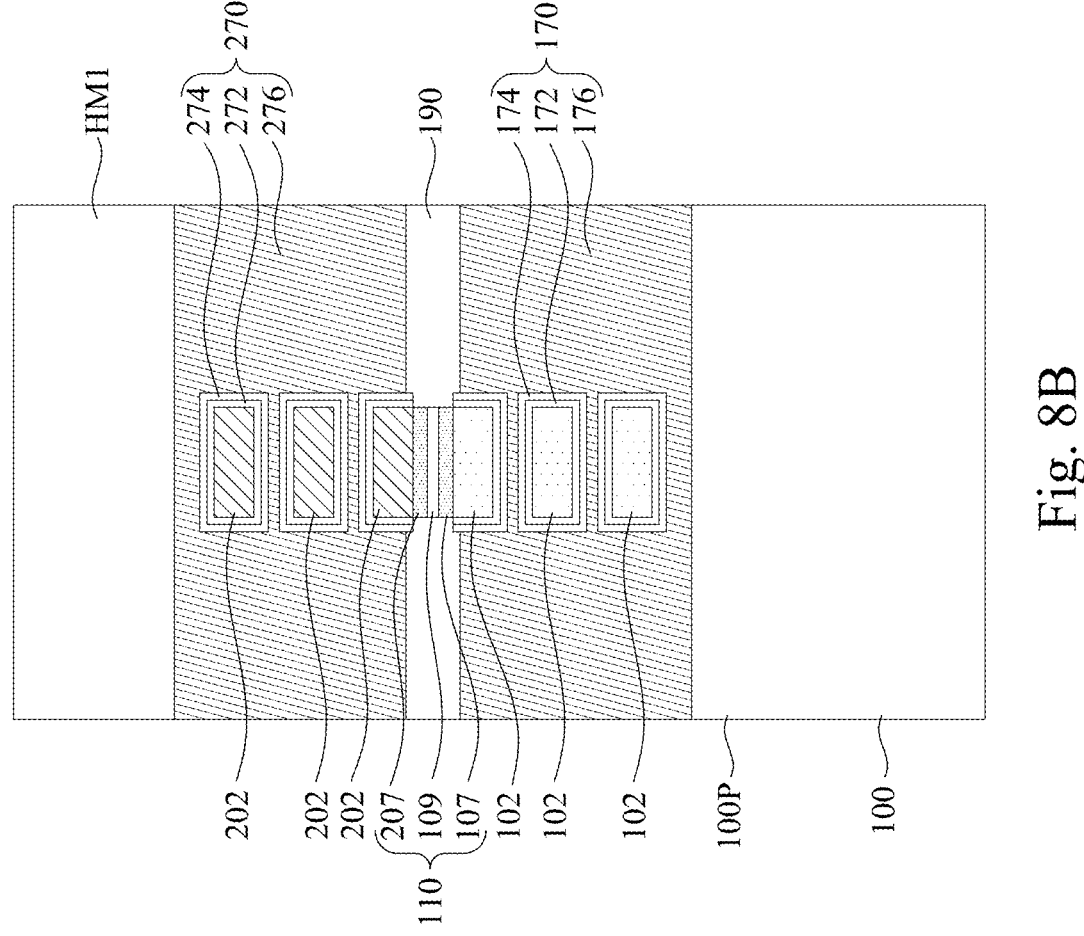

FIGS. 2 to 8B illustrate a method in various stages of forming a semiconductor device in accordance with some embodiments of the present disclosure. It is noted that FIGS. 2, 3, 4, 5A, 6A, 7A, and 8A include cross-sectional views the same as the cross-sectional view along line A-A of FIG. 1. FIGS. 5B, 6B, and 7B include cross-sectional views the same as the cross-sectional view along line B-B of FIG. 1. FIG. 8B includes a cross-sectional view the same as the cross-sectional view along line C-C of FIG. 1. Although FIGS. 2 to 8B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. It is noted that some elements of FIGS. 2 to 8B may be similar to those described with respect to FIG. 1, and thus relevant details will not be repeated for brevity.

Figure 2:
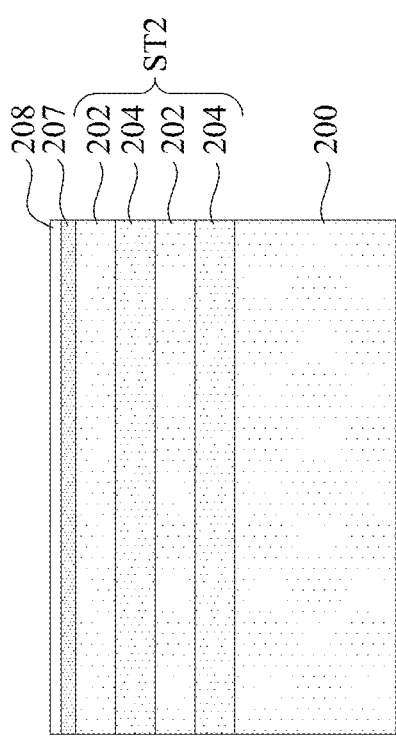
FIGS. 2 to 8B illustrate a method in various stages of forming a semiconductor device in accordance with some embodiments of the present disclosure.
Figure 2:
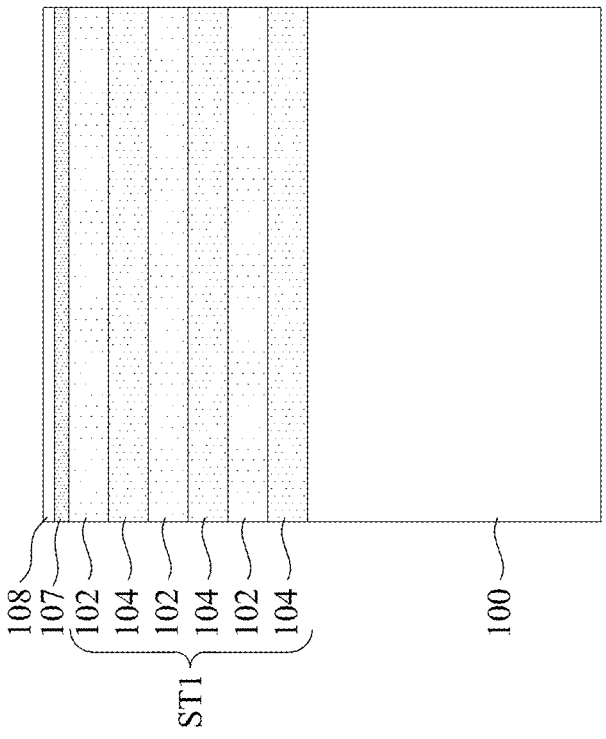

Reference is made to FIG. 2. Shown there are a substrate 100 and a substrate 200. Generally, the substrates 100 and 200 may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

With respect to the substrate 100, a first stack ST1 of alternating semiconductor layers 102 and 104 is formed over the substrate 100. Then, a high-kappa layer 107 is formed over the first stack ST1, and a dielectric layer 108 is formed over the high-kappa layer 107. In greater detail, the high-kappa layer 107 is in contact with the topmost semiconductor layer 102.

On the other hand, with respect to the substrate 200, a second stack ST2 of alternating semiconductor layers 202 and 204 is formed over the substrate 200. Then, a high-kappa layer 207 is formed over the second stack ST2, and a dielectric layer 208 is formed over the high-kappa layer 207. In greater detail, the high-kappa layer 207 is in contact with the topmost semiconductor layer 202.

In some embodiments, the semiconductor layers 102 and 202 may be made of pure silicon layers that are free of germanium. In some embodiments, the semiconductor layers 102 and 202 may also be substantially pure silicon layers, for example, with a germanium percentage lower than about 1 percent. The semiconductor layers 104 and 204 may be made of silicon germanium. For example, the germanium percentage (atomic percentage concentration) of the semiconductor layers 104 and 204 may be in a range from about 20 percent and about 60 percent. In some embodiments, the semiconductor layers 102, 104, 202, and 204 may be deposited using suitable deposition process, such as selective epitaxial growth (SEG), chemical vapor deposition (CVD), molecular beam epitaxy (MBE), or other suitable process(es). In some embodiments, the semiconductor layers 104 and 204 may be removed during a replacement gate (RPG) process, and thus the semiconductor layers 104 and 204 can also be referred to as sacrificial layers.

Here, the term "high-kappa layer" may be referred to as a layer having higher thermal conductivity (kappa; κ). For example, in some embodiments, the high-kappa layers 107 and 207 may include a high-kappa material having a thermal conductivity greater than about 10 W/m*K. The thermal conductivity of the high-kappa material is in a range from about 10 W/m*K to about 2000 W/m*K. The high-kappa material may include nitride, such as aluminum nitride (AlN), boron nitride (BN), or the like. The high-kappa material may also include metal oxide, such as yttrium oxide ($Y_2O_3$), yttrium aluminum garnet (YAG; $Y_3Al_5O_{12}$), aluminum oxide ($Al_2O_3$), beryllium oxide (BeO), or the like. The high-kappa material may also include carbide, such as silicon carbide (SiC), or the like. The high-kappa material may also include graphene, diamond-like carbon (DLC), diamond, or the like. In some embodiments, the high-kappa layers 107 and 207 may include crystalline structure, and may also be referred to as crystalline layers. In some embodiments, the high-kappa layers 107 and 207 are made of different high-kappa materials.

In some embodiments, the dielectric layers 108 and 208 may be made of silicon oxide (SiO2), silicon nitride (SiN), and silicon carbide (SiC), or the like. In some embodiments, the dielectric layers 108 and 208 have a lower thermal conductivity than the high-kappa layers 107 and 207. For example, if the dielectric layers 108 and 208 are made of silicon oxide (SiO2), the thermal conductivity of SiO2 is about 1 W/m*K. In some embodiments, the dielectric layers 108 and 208 may be made of a same dielectric material or may be made of different dielectric materials. In some embodiments, the dielectric layers 108 and 208 may include amorphous structure, and may also be referred to as amorphous layers. The dielectric layers 108 and 208 may reduce the thermal boundary resistance between the high-kappa layers 107 and 207 after the bonding process (see FIG. 3), which is beneficial for improving the thermal dissipation of the device.

In some embodiments, each of the high-kappa layers 107 and 207 may include a thickness in a range from about 0.5 nm to about 50 nm. If the thickness of the high-kappa layers 107 and 207 is too thin (e.g., much less than 0.5 nm), the high-kappa layers 107 and 207 may not be able to provide sufficient thermal dissipation capability. If the thickness of the high-kappa layers 107 and 207 is too thick (e.g., much greater than 50 nm), there is no additional benefit for thermal dissipation. In some embodiments, each of the dielectric layers 108 and 208 may include a thickness in a range from about 5 Å to about 50 Å. If the thickness of the dielectric layers 108 and 208 is too thin (e.g., much less than 5 Å), the dielectric layers 108 and 208 may not be able to sufficiently lower the thermal boundary resistance between the high-kappa layers 107 and 207. If the thickness of the dielectric layers 108 and 208 is too thick (e.g., much greater than 50 Å), the thermal conductivity may be decreased and will deteriorate the thermal dissipation between the high-kappa layers 107 and 207. In some embodiments, the high-kappa layers 107 and 207 may be thicker than the dielectric layers 108 and 208.

Figure 3:
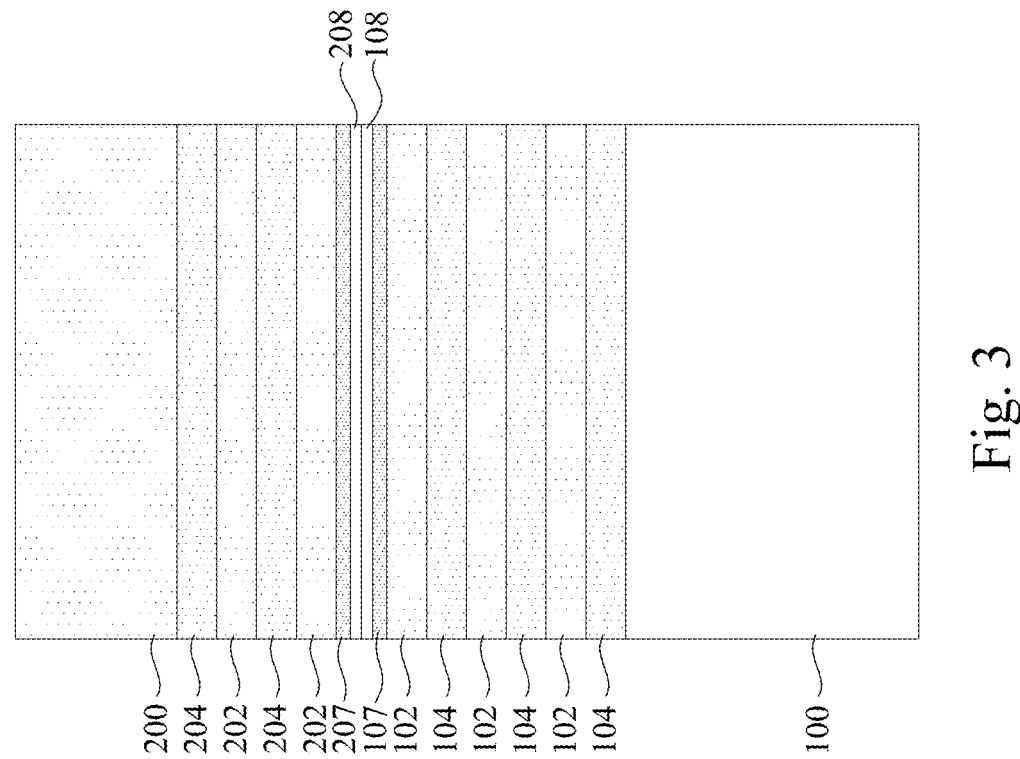

Reference is made to FIG. 3. The substrates 100 and 200 are bonded with each other. For example, in FIG. 3, the substrate 200 is flipped over by 180 degrees, such that the dielectric layer 208 on the substrate 200 faces the dielectric layer 108 on the substrate 100.

Then, the dielectric layers 108 and 208 are bonded with each other using a suitable technique. In some embodiments, the bonding process may further include applying surface treatments to the surfaces of the dielectric layers 108 and 208, respectively. The surface treatment may include a plasma treatment. The plasma treatment may be performed in a vacuum environment. After the plasma treatment, the surface treatment may further include a cleaning process (e.g., a rinse with deionized water, or the like) that may be applied to the dielectric layers 108 and 208. The dielectric layers 108 and 208 are pressed against each other to initiate a pre-bonding of the substrates 100 and 200. The pre-bonding may be performed at room temperature (between about 21 degrees and about 25 degrees). After the pre-bonding, an annealing process may be applied to the dielectric layers 108 and 208 that have already been pressed against each other. The annealing process results in an increased bonding force between the dielectric layers 108 and 208, such that even if the dielectric layers 108 and 208 are no longer subjected to the pressing force, they will not delaminate or peel from each other. In some embodiments, the dielectric layers 108 and 208 can also be referred to as bonding layers in the bonding process. In some embodiments, the high-kappa layers 107 and 207, and the dielectric layers 108 and 208 can be collectively referred to as a bonding structure.

Figure 4:
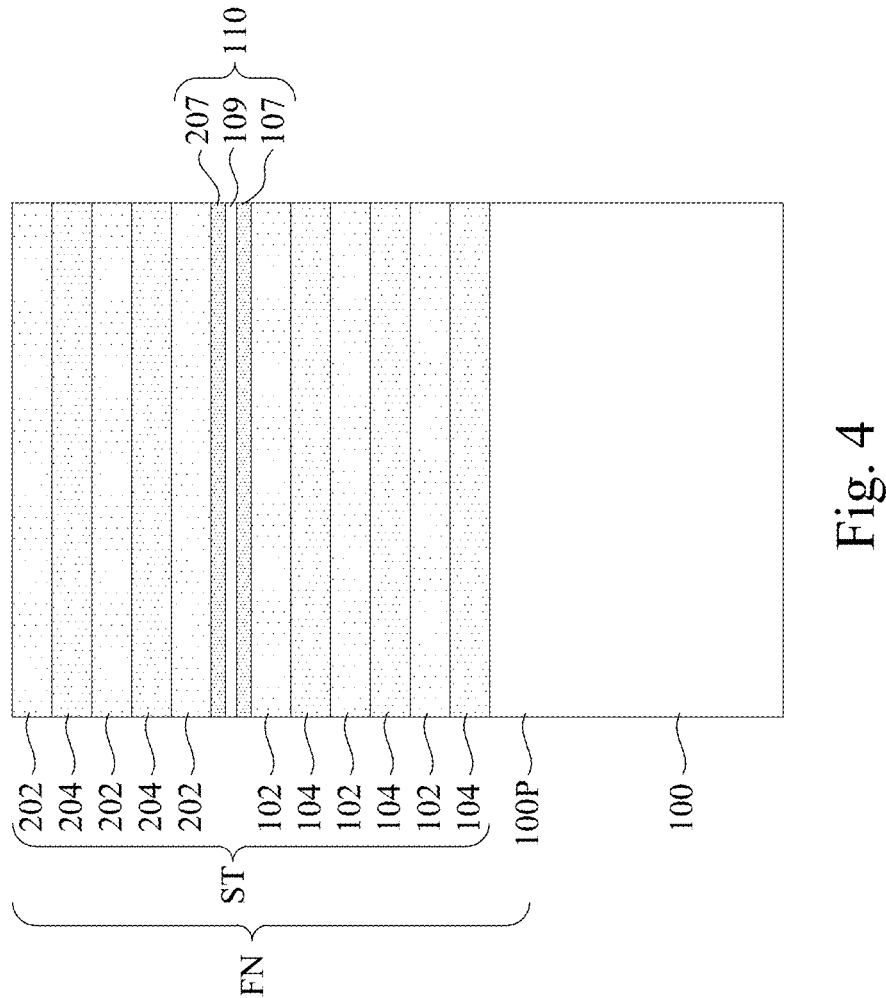

Reference is made to FIG. 4. A grinding process is performed on a backside of the substrate 200, so as to reduce a thickness of the substrate 200 to a desired thickness. The remaining portion of the substrate 200 may also act as a channel layer in the semiconductor device, and thus the remaining portion of the substrate 200 can also be referred to as a semiconductor layer 202. For example, the remaining portion of the substrate 200 has substantially a same thickness than the underlying semiconductor layers 202.

It is noted that, the dielectric layers 108 and 208 of FIG. 3 is illustrated as a single dielectric layer 109 in FIG. 4 for simplicity. Here, the first stack ST1, the second stack ST2, the high-kappa layers 107 and 207, and the dielectric layer 109 can be collectively referred to as a stack ST. Each of the high-kappa layers 107 and 207 can be referred to as a heat dissipation layer. Moreover, the high-kappa layers 107 and 207, and the dielectric layer 109 can be collectively referred to as a heat dissipation multilayer 110, and will be discussed in the following content.

Figure 5B:
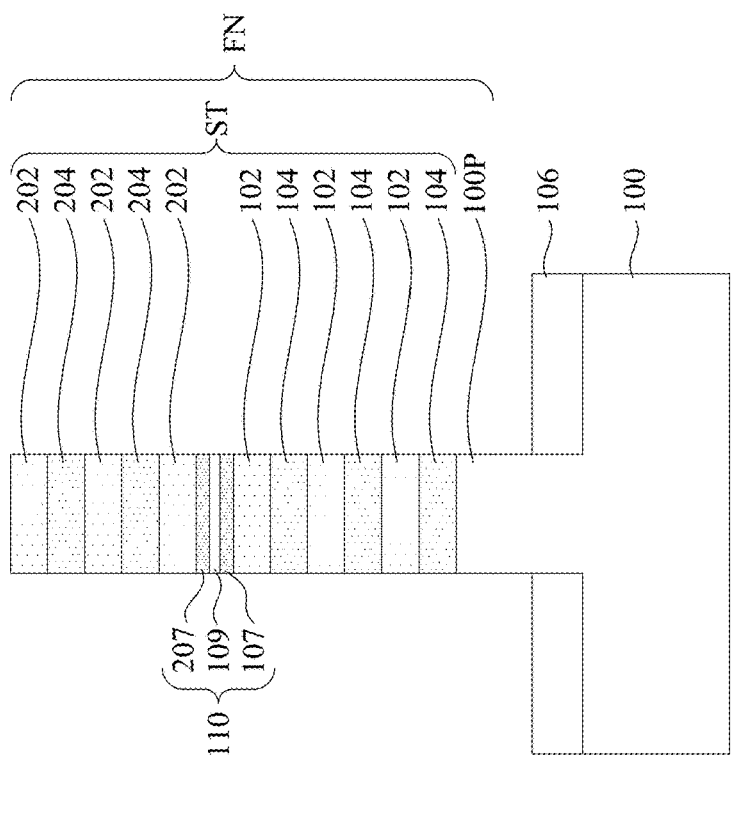
Figure 5A:
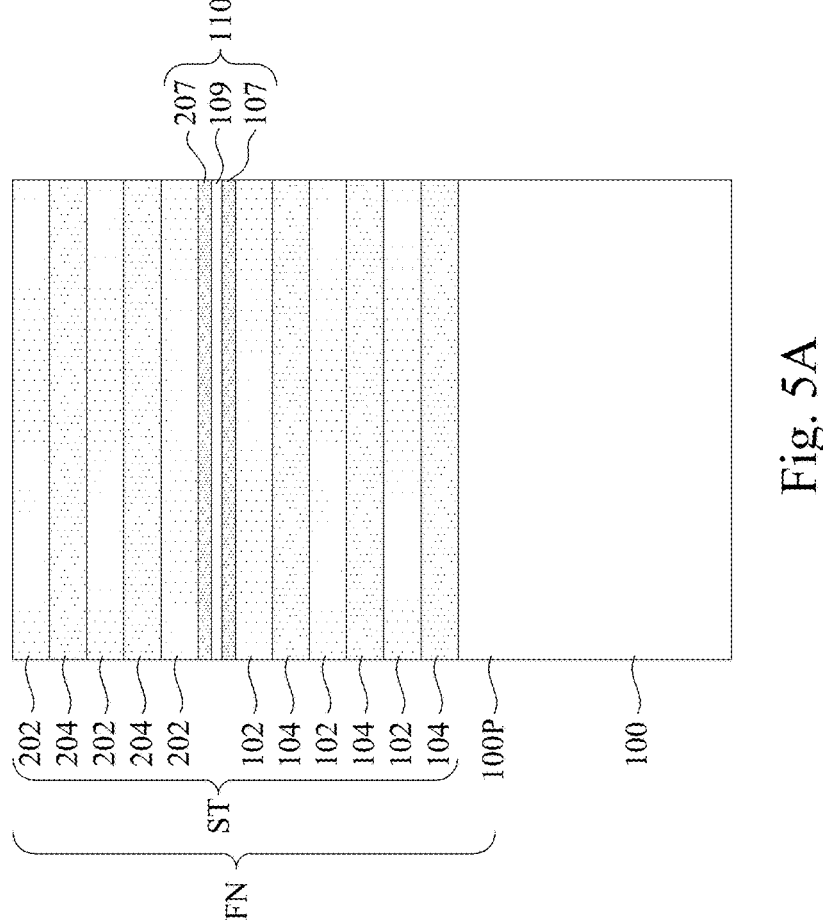

Reference is made to FIGS. 5A and 5B. A patterning process is performed to the stack ST and the substrate 100 to form a fin structure FN. In some embodiments, the patterning process may include forming a patterned photoresist layer over the stack ST, and then performing an etching process to remove unwanted portions of the stack ST and the substrate 100 exposed by the patterned photoresist layer. The fin structure FN may include a remaining portion of the stack ST and a semiconductor strip 100P protruding over the substrate 100. In some embodiments, the etching process may include wet etch, dry etch, or the like.

After the fin structure FN is formed, isolation structures 106 are formed over the substrate 100 and laterally surrounding the fin structure FN. In some embodiments, the isolation structures 106 may be in contact with sidewalls of the semiconductor strip 100P of the substrate 100. The isolation structures 106 may be shallow trench isolation (STI) structures, suitable isolation structures, combinations of the foregoing, or the like. In some embodiments, the isolation structures 106 may be made of oxide (e.g., silicon oxide), nitride (e.g., silicon nitride), or combinations thereof.

Reference is made to FIGS. 6A and 6B. Dummy gate structures 130 are formed over the substrate 100 and crossing the fin structure FN. In some embodiments, each of the dummy gate structures 130 includes a dummy gate dielectric 132 and a dummy gate electrode 134 over the dummy gate dielectric 132. The dummy gate dielectric 132 may be, for example, silicon oxide, silicon nitride, a combination thereof, or the like, and may be deposited or thermally grown according to acceptable techniques. The dummy gate electrode 134 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals.

The dummy gate electrode 134 and the dummy gate dielectric 132 may be formed by, for example, depositing a dummy dielectric layer and a dummy gate layer over the substrate 100, forming patterned masks MA1 over the dummy gate layer, and then performing an etching process to the dummy dielectric layer and the dummy gate layer by using the patterned masks MA1 as etch mask. In some embodiments, the dummy gate electrode 134 may be deposited by physical vapor deposition (PVD), chemical vapor deposition (CVD), sputter deposition, or other techniques for depositing the selected material. In some embodiments, the dummy gate dielectric 132 may be formed by thermal oxidation.

In some embodiments, each of the patterned masks MA1 includes a first hard mask 330 and a second hard mask 332 over the first hard mask 330. The first hard mask 330 and the second hard mask 332 may be made of different materials. In some embodiments, the first hard mask 330 may be formed of silicon nitride, and the second hard mask 332 may be formed of silicon oxide.

Spacers 115 are formed on opposite sidewalls of each of the dummy gate structures 130 (see FIG. 6A), and on opposite sidewalls of the fin structure FN (see FIG. 6B). In some embodiments, portions of the spacers 115 on opposite sidewalls of each of the dummy gate structures 130 can be referred to as gate spacers, and portions of the spacers 115 on opposite sidewalls of the fin structure FN can be referred to as fin spacers. In some embodiments, the spacers 115 may be formed of silicon oxide, silicon nitride, silicon oxynitride, combinations thereof. In some embodiments, the spacers 115 may be formed by, for example, depositing a spacer layer blanket over the substrate, and then performing an anisotropic etching process to remove horizontal portions of the spacer layer, such that vertical portions of the spacer layer remain on sidewalls of the dummy gate structures 130 and on sidewalls of the fin structure FN. In some embodiments, the remaining vertical portions of the spacer layer can be referred to as the spacers 115. The spacer layer may be deposited using techniques such CVD, ALD, or the like.

Reference is made to FIGS. 7A and 7B. An etching process is performed to remove portions of the fin structure FN (or stack ST) by using the dummy gate structures 130 and the spacers 115 as etch mask, so as to form source/drain openings in the fin structure FN (or in the stack ST). In some embodiments, the etching process may be wet etch, dry etch, or combinations thereof.

The semiconductor layers 104 and the semiconductor layers 204 are laterally etched to form sidewall recesses. Similarly, the heat dissipation multilayer 110 is laterally etched to form sidewall recesses. In some embodiments, the sidewalls of the semiconductor layers 104 and 204 may be etched using isotropic etching processes, such as wet etching or the like. In some embodiments where the semiconductor layers 104 and 204 include, e.g., SiGe, and the semiconductor layers 102 and 202 include, e.g., Si, an etch process with tetramethylammonium hydroxide (TMAH), ammonium hydroxide (NH₄OH), or the like may be used to etch sidewalls of the semiconductor layers 104 and 204. On the other hand, the heat dissipation multilayer 110 may be etched using suitable etchant. In some embodiments, a first etching process is performed to etch the semiconductor layers 104 and 204, and a second etching process is performed to etch the heat dissipation multilayer 110. The first etching process may be performed prior to or after the second etching process.

Afterwards, inner spacers 116 are formed in the sidewall recesses on opposite ends of each of the semiconductor layers 104, the semiconductor layers 204, and the heat dissipation multilayer 110. The inner spacers 116 may be deposited by a conformal deposition process, such as CVD, ALD, or the like. The dielectric layer may include a material such as SiN, SiOCN, SiCN, SIOC, although any suitable material, such as low-dielectric constant (low-k) materials having a k-value less than about 3.5, may be utilized. In some embodiments, opposite ends of the heat dissipation multilayer 110 are in contact with the respective inner spacers 116.

Epitaxy layers 142 are formed at bottoms of the source/drain openings, and then first source/drain epitaxy structures 140 are formed over the epitaxy layers 142, respectively. In some embodiments, the formation of the epitaxy layers 142 may include a plurality of deposition cycles, in which each deposition cycle may include a selective epitaxial growth (SEG) process and an etching process. The first source/drain epitaxy structures 140 may be formed by suitable deposition process, such as a selective epitaxial growth (SEG) process. In some embodiments, the SEG process may selectively grow a semiconductor material on exposed semiconductor surfaces, such as the exposed surfaces of the epitaxy layers 142 and the exposed surfaces of the semiconductor layers 102. In some embodiments, an implantation process may be performed to the first source/drain epitaxy structures 140. For example, the implantation process may include p-type dopants, such as boron (B), gallium (Ga), indium (In), aluminium (Al), or the like, such that the first source/drain epitaxy structures 140 are p-type epitaxy structures. In some embodiments, the epitaxy layers 142 may be formed without performing an implantation process, and thus the epitaxy layers 142 are un-doped.

A contact etch stop layer (CESL) 155 is formed covering the first source/drain epitaxy structures 140. Afterwards, an interlayer dielectric (ILD) layer 152 is formed over the CESL 155. An etching back process may be performed to lower top surfaces of the CESL 155 and the ILD layer 152, such that sidewalls of the semiconductor layers 202 are exposed through the source/drain openings. In some embodiments, the CESL 155 and the ILD layer 152 can be collectively referred to as an isolation structure 150. In some embodiments, the topmost semiconductor layer 102 and the bottommost semiconductor layer 202 are in contact with the CESL 155 of the isolation structure 150.

In some embodiments, the CESL 155 may be a dielectric layer including silicon nitride, silicon oxynitride or other suitable materials. In some embodiments, the ILD layer 152 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The CESL 155 and the ILD layer 152 can be formed using, for example, CVD, ALD or other suitable techniques.

Second source/drain epitaxy structures 240 are formed on opposite ends of each of the semiconductor layers 202. In some embodiments, the second source/drain epitaxy structures 240 may be formed by a selective epitaxial growth (SEG) process. The SEG process may selectively grow a semiconductor material on exposed semiconductor surfaces, such as the exposed surfaces of the semiconductor layers 202. In some embodiments, an implantation process may be performed to the second source/drain epitaxy structures 240. For example, the implantation process may include n-type dopants, such as phosphorus (P), arsenic (As), or antimony (Sb), or the like, such that the second source/drain epitaxy structures 240 are n-type epitaxy structures.

A contact etch stop layer (CESL) 255 is formed covering the second source/drain epitaxy structures 240, and an interlayer dielectric (ILD) layer 252 is formed over the CESL 255. Then, a planarization process, such as CMP, is performed to remove excess materials of the CESL 255 and the ILD layer 252 until the dummy gate structures 130 are exposed. In some embodiments, the patterned masks MA1 are removed during the planarization process. In some embodiments, the CESL 255 and the ILD layer 252 can be collectively referred to as an isolation structure 250. The materials of the CESL 255 and the ILD layer 252 may be similar to the materials of the CESL 155 and the ILD layer 152, respectively, and thus relevant details will not be repeated for brevity. In some embodiments, the isolation structures 150 and 250 may collectively form a composite isolation structure.

Reference is made to FIGS. 8A and 8B. The dummy gate structures 130 are removed to form gate trenches between each pair of the spacers 115. Then, an etching process is performed to remove the semiconductor layers 104 and 204 through the gate trenches, such that that the semiconductor layers 102 and the semiconductor layers 202 are suspended over the substrate 100.

Interfacial layers 172 and 272 are formed on exposed surfaces of the semiconductor layers 102 and 202, respectively. Then, gate dielectric layers 174 and 274 are formed over the interfacial layers 172 and 272, respectively. In some embodiments, the interfacial layers 172 and 272 may be formed using a same deposition process, and the gate dielectric layers 174 and 274 may be formed using a same deposition process.

After the interfacial layers 172 and 272 and the gate dielectric layers 174 and 274 are formed, gate electrodes 176 are formed in the gate trenches and over the gate dielectric layers 174. The gate electrodes 176 are then etched back. In some embodiments, the top surface of the gate electrode 176 may be lower than the bottom surface of the heat dissipation multilayer 110.

Accordingly, first metal gate structures 170 are formed. Each of the first metal gate structures 170 may include the interfacial layer 172, the gate dielectric layer 174 over the interfacial layer 172, and the gate electrode 176 over the gate dielectric layer 174. The first metal gate structures 170 may wrap around the respective semiconductor layers 102.

In some embodiments, the interfacial layers 172 and 272 may be made of oxide, such as aluminum oxide (Al₂O₃), silicon oxide ($SiO_2$), or the like. In some embodiments, the gate dielectric layers 174 and 274 may include high-k dielectric. Examples of high-k dielectric material include $HfO_2$, HfSiO, HfSiON, HfTaO, HfTaO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrodes 176 may include work function metal layer(s) and a filling metal. The work function metal layer may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The filling metal may include tungsten (W), aluminum (Al), copper (Cu), or another suitable conductive material(s).

As shown in the cross-sectional view of FIG. 8B, a high-kappa layer 190 is formed over the gate electrodes 176. The high-kappa layer 190 may be in contact with the heat dissipation multilayer 110. In some embodiments, the high-kappa layer 190 can also be referred to as a heat dissipation layer. The high-kappa layer 190 may be formed by, for example, depositing a high-kappa material in the gate trenches, and then etching back the high-kappa material, such that the top surface of the kappa material is lowered to a desired position. For example, the top surface of the high-kappa layer 190 is lower than the top surface of the bottommost semiconductor layer 202. In some embodiments, the high-kappa layer 190 may include high-kappa material similar to the materials of the high-kappa layers 107 and 207 as described above, and thus relevant details will not be repeated for brevity.

Gate electrodes 276 are formed in the gate trenches and over the first metal gate structures 170. Accordingly, second metal gate structures 270 are formed. Each of the second metal gate structures 270 may include the interfacial layer 272, the gate dielectric layer 274 over the interfacial layer 272, and the gate electrode 276 over the gate dielectric layer 274. The second metal gate structures 270 may wrap around the respective semiconductor layers 202. The materials of the gate electrode 276 may be similar to those described with respect to the gate electrode 176, and thus relevant details will not be repeated for brevity.

As shown in FIG. 8B, the gate electrode 276 is in contact with the top surface of the high-kappa layer 190. That is, the gate electrode 176 is vertically separated from the overlying gate electrode 276 through the high-kappa layer 190. The high-kappa layer 190 can serve as an isolation layer between the gate electrodes 176 and 276, and can also serve as a heat dissipation layer between the gate electrodes 176 and 276. In some embodiments, the high-kappa layer 190 may be in contact with sidewalls of the heat dissipation multilayer 110.

The second metal gate structures 270 are then etched back, such that top surfaces of the second metal gate structures 270 are lower than top surfaces of the gate spacers 115. Afterwards, hard masks HM1 are formed over the respectively second metal gate structures 270. In some embodiments, the hard masks HM1 may include one or more layers of dielectric material such as silicon nitride based material including SiN, SiCN and SiOCN. The hard masks HM1 may be formed by, for example, depositing a dielectric layer over the etched back second metal gate structures 270, and then performing a planarization process, such as CMP, on the dielectric layer until the isolation structures 250 are exposed.

The first metal gate structure 170, the first source/drain epitaxy structures 140 on opposite sides of the first metal gate structure 170, and the semiconductor layers 102 that are in contact with the first source/drain epitaxy structures 140 may collectively serve as the first transistor TR1 as described in FIG. 1. In such condition, the semiconductor layers 102 that are in contact with the first source/drain epitaxy structures 140 may also be referred to as channel layers of the first transistor TR1. Similarly, the second metal gate structure 270, the second source/drain epitaxy structures 240 on opposite sides of the second metal gate structure 270, and the semiconductor layers 202 that are in contact with the second source/drain epitaxy structures 240 may collectively serve as the second transistor TR2 as described in FIG. 1. In such condition, the semiconductor layers 202 that are in contact with the second source/drain epitaxy structures 240 may also be referred to as channel layers of the second transistor TR2. In FIG. 8A, opposite ends of the topmost semiconductor layer 102 are in contact with the isolation structures 150, and are not in contact with the first source/drain epitaxy structures 140. Thus, the topmost semiconductor layer 102 may not function as a channel layer of the first transistor TR1. Similarly, opposite ends of the bottommost semiconductor layer 202 are in contact with the isolation structure 150, and are not in contact with the second source/drain epitaxy structures 240. Thus, the topmost bottommost semiconductor layer 202 may not function as a channel layer of the second transistor TR2.

In some embodiments of the present disclosure, a heat dissipation multilayer 110, which includes a high-kappa layer 107 and a high-kappa layer 207, is integrated in a CFET structure. In greater detail, the heat dissipation multilayer 110 is formed between the first transistor TR1 and the second transistor TR2, which is beneficial for the heat dissipation between the first transistor TR1 and the second transistor TR2, and will be discussed below.

In some embodiments where the high-kappa layers 107 and 207 are made of different high-kappa materials, if the high-kappa layers 107 and 207 are in contact with each other, the high-kappa layers 107 and 207 may suffer from high thermal boundary resistance at the interface due to phonon frequency mismatch. In some embodiments, phonon frequency mismatch refers to a situation in which the phonon frequencies of two adjacent materials in a device are not matched, resulting in a mismatch or discontinuity at the interface between the two materials. Phonons are quantum mechanical vibrations in a crystal lattice, which serve for the transport of energy and heat in the adjacent materials. When two adjacent materials have distinct phonon frequencies, it can result in a mismatch or discontinuity at the interface, which can lead to a range of effects including phonon scattering, reduced thermal conductivity, and increased thermal resistance.

For example, as shown in FIGS. 21A and 21B, a first high-kappa material M1 is in contact with a second high-kappa material M2 (see FIG. 21B). The first high-kappa material M1 and the second high-kappa material M2 are made of different high-kappa materials, and may include different crystalline structures, which allow phonon transmits with specific frequencies. For example, as shown in FIG. 21A, the first high-kappa material M1 may allow phonon transmits with a first phonon frequency range $\omega_{D1}$, while the second high-kappa material M2 may allow phonon transmits with a second phonon frequency range $\omega_{D2}$ that is distinct from the first phonon frequency range $\omega_{D1}$. As a result, as shown in FIG. 21B, in such situation, phonon reflection may occur at the interface between the first high-kappa material M1 and the second high-kappa material M2 due to phonon frequency mismatch. This will affect the heat dissipation from the second high-kappa material M2 to the first high-kappa material M1, and therefore will increase the thermal boundary resistance at the interface between the first high-kappa material M1 and the second high-kappa material M2.

As a result, embodiments of the present disclosure include inserting a dielectric layer 109, which includes an amorphous structure, between the high-kappa layers 107 and 207. The dielectric layer 109 can act as a bridging layer between the high-kappa layers 107 and 207, and will improve the heat dissipation between the high-kappa layers 107 and 207.

For example, as shown in FIGS. 22A and 22B, a bridging material M3 is inserted between the first high-kappa material M1 and the second high-kappa material M2 (see FIG. 22B). The bridging material M3 is made of a dielectric material with amorphous structure, which allows phonon transmits with a broaden bandwidth of phonon frequency range. For example, as shown in FIG. 22A, the bridging material M3 may allow phonon transmits with a broaden bandwidth, which overlaps the first phonon frequency range $\omega_{D1}$ and the second phonon frequency range $\omega_{D2}$. Accordingly, heat can be successfully transmitted from the second high-kappa material M2 to the first high-kappa material M1 through the bridging material M3 without frequency mismatch issue. Phonon frequency range of a given material (e.g., the first high-kappa material M1, the second high-kappa material M2, or the bridging material M3) may be detected or measured by using various techniques, such as Raman spectroscopy, Brillouin scattering, inelastic neutron scattering, infrared spectroscopy, ultrasonic measurements, or other suitable techniques.

Accordingly, with the dielectric layer 109, the heat dissipation between the high-kappa layers 107 and 207, as well as the heat dissipation between the first transistor TR1 and the second transistor TR2, may be improved.

Figure 9:
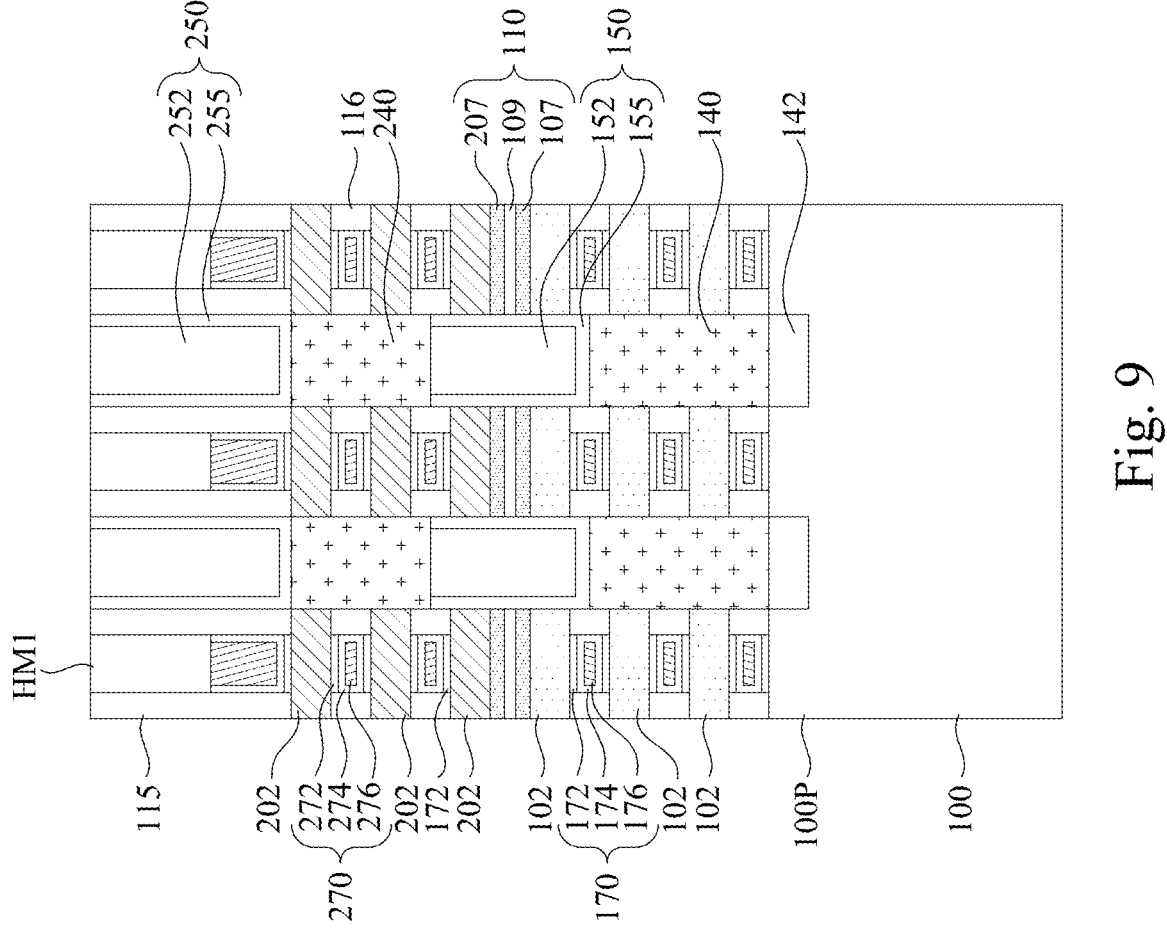
FIG. 9 illustrates a semiconductor device in accordance with some embodiments of the present disclosure.

FIG. 9 illustrates a semiconductor device in accordance with some embodiments of the present disclosure. It is noted that FIG. 9 has a same cross-sectional view as FIG. 8A. Some elements described in FIG. 9 may be similar to those described with respect to FIGS. 2 to 8B, such elements are labeled the same, and relevant details will not be repeated for brevity.

The difference between the embodiments of FIG. 9 and the embodiments of FIG. 8A is that the heat dissipation multilayer 110 is not etched during the processes as discussed in FIGS. 7A and 7B. As a result, opposite ends of the heat dissipation multilayer 110 may be in contact with the isolation structures 150. In some embodiment, sidewall of the heat dissipation multilayer 110 may be vertically aligned with sidewall of the topmost semiconductor layer 102 and sidewall of the bottommost semiconductor layer 202.

FIGS. 10 to 20 illustrate a method in various stages of forming a semiconductor device in accordance with some embodiments of the present disclosure. It is noted that FIGS. 10, 11, 12, 13A, 14A, 15A, 16A, 17, 18, 19, 20 include cross-sectional views the same as the cross-sectional view along line A-A of FIG. 1. FIGS. 13B, 14B, 15B, 16B include cross-sectional views the same as the cross-sectional view along line B-B of FIG. 1. It is noted that some elements of FIGS. 10 to 20 may be similar to those described with respect to FIG. 1 and FIGS. 2 to 8B, such elements are labeled the same, and relevant details will not be repeated for brevity.

Figure 10:
FIGS. 10 to 20 illustrate a method in various stages of forming a semiconductor device in accordance with some embodiments of the present disclosure.
Figure 10:
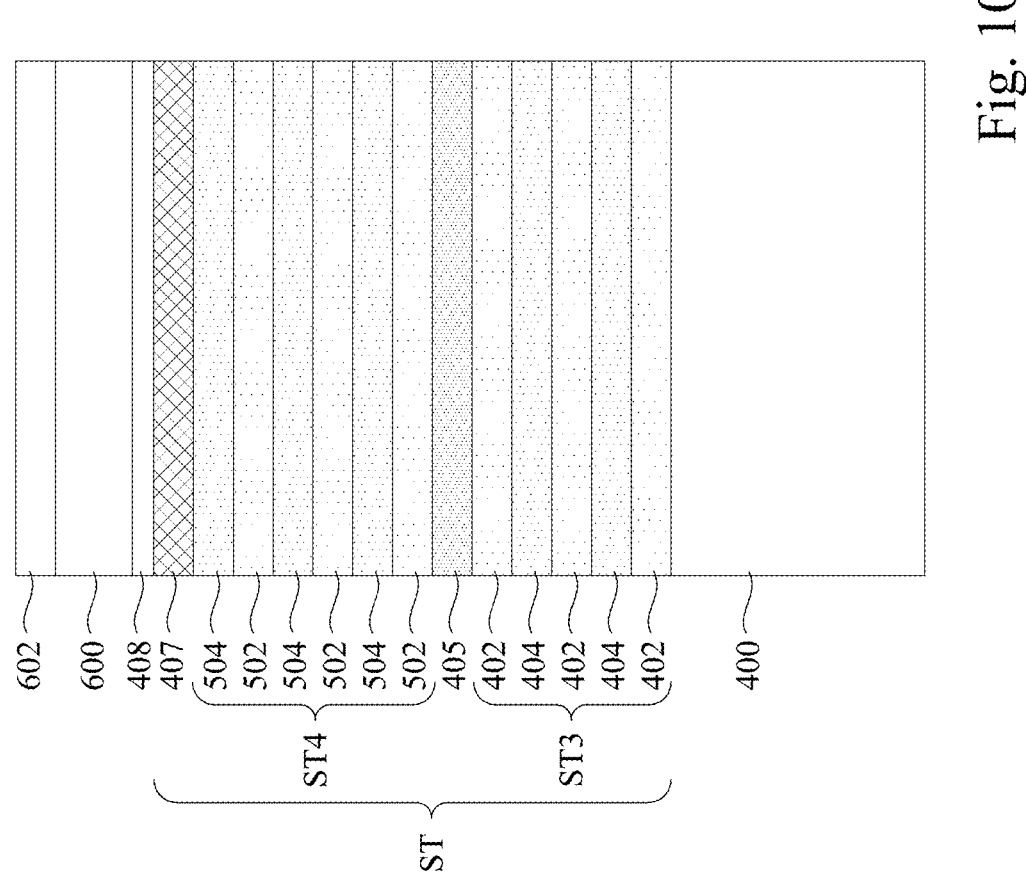

Reference is made to FIG. 10. Shown there are a substrate 400 and a substrate 500. The materials of the substrates 400 and 500 may be similar to the materials of the substrates 100 and 200 as described above, and thus relevant details will not be repeated for brevity.

A semiconductor stack ST is formed over the substrate 400. The semiconductor stack ST includes a first stack ST3 of alternating semiconductor layers 402 and 404, a semiconductor layer 405 disposed over the first stack ST3, and a second stack ST4 of alternating semiconductor layers 502 and 504 over the semiconductor layer 405. In some embodiments, the semiconductor layers 402 and 502 may be made of pure silicon layers that are free of germanium. The semiconductor layers 402 and 502 may also be substantially pure silicon layers, for example, with a germanium percentage lower than about 1 percent. The semiconductor layers 404, 405, and 504 may be made of silicon germanium, while the semiconductor layer 405 may include a higher germanium composition than the semiconductor layers 404 and 504. For example, the germanium percentage (atomic percentage concentration) of the semiconductor layer 405 is in a range from about 60 percent and about 80 percent, and the germanium percentage (atomic percentage concentration) of the semiconductor layers 304 and 304 is in a range from about 20 percent and about 40 percent. In some embodiments, the semiconductor layers 402, 404, 405, 502, and 504 may be deposited using suitable deposition process, such as selective epitaxial growth (SEG), chemical vapor deposition (CVD), molecular beam epitaxy (MBE), or other suitable process(es). In some embodiments, the semiconductor layers 404 and 504 may be removed during a replacement gate (RPG) process, and thus the semiconductor layers 404 and 504 can also be referred to as sacrificial layers.

A high-kappa layer 407 is formed over the stack ST. In greater detail, the high-kappa layer 407 is formed on the topmost semiconductor layer 502. A dielectric layer 408 is formed over the high-kappa layer 407. In some embodiments, the high-kappa layer 407 and the dielectric layer 408 may be formed using suitable deposition process, such as PVD, CVD, ALD, or the like. The material of the high-kappa layer 407 may be similar to the material of the high-kappa layers 107 and 207 as discussed above, and thus relevant details will not be repeated for brevity. The material of the dielectric layer 408 may be similar to the material of the dielectric layers 108 and 208 as discussed above, and thus relevant details will not be repeated for brevity.

A semiconductor layer 600 is formed over the dielectric layer 408. In some embodiments, the semiconductor layer 600 may be made of amorphous silicon (a-Si). Then, a bonding layer 602 is formed over the semiconductor layer 600. In some embodiments, the semiconductor layer 600 and the bonding layer 602 may be formed using suitable deposition process, such as PVD, CVD, ALD, or the like.

With respect to the substrate 500, a bonding layer 604 is formed over the substrate 500. In some embodiments, the bonding layer 604 may be formed using suitable deposition process, such as PVD, CVD, ALD, or the like. The bonding layers 602 and 604 may include dielectric material such as silicon oxide ($SiO_x$), silicon dioxide ($SiO_2$), or other suitable materials. In some embodiments, the bonding layers 602 and 604 may include a same bonding material. In other embodiments, the bonding layers 602 and 604 may include different bonding materials.

Figure 11:
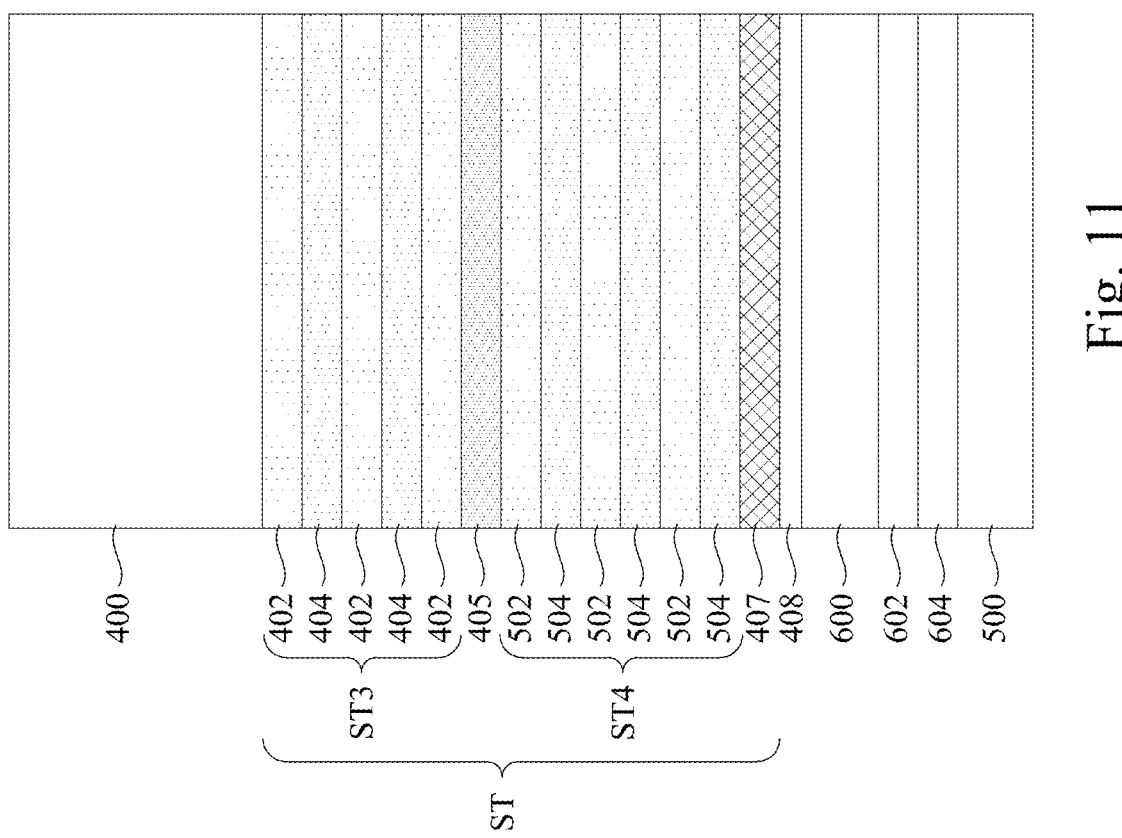

Reference is made to FIG. 11. The substrate 400 is bonded to the substrate 500. For example, in FIG. 11, the substrate 400 is flipped over by 180 degrees, such that the bonding layer 602 on the substrate 400 faces the bonding layer 604 on the substrate 500. Then, the bonding layers 602 and 604 are bonded with each other using a suitable technique. The bonding process is similar to the bonding process as discussed in FIG. 4, and thus relevant details will not be repeated for brevity.

Figure 12:
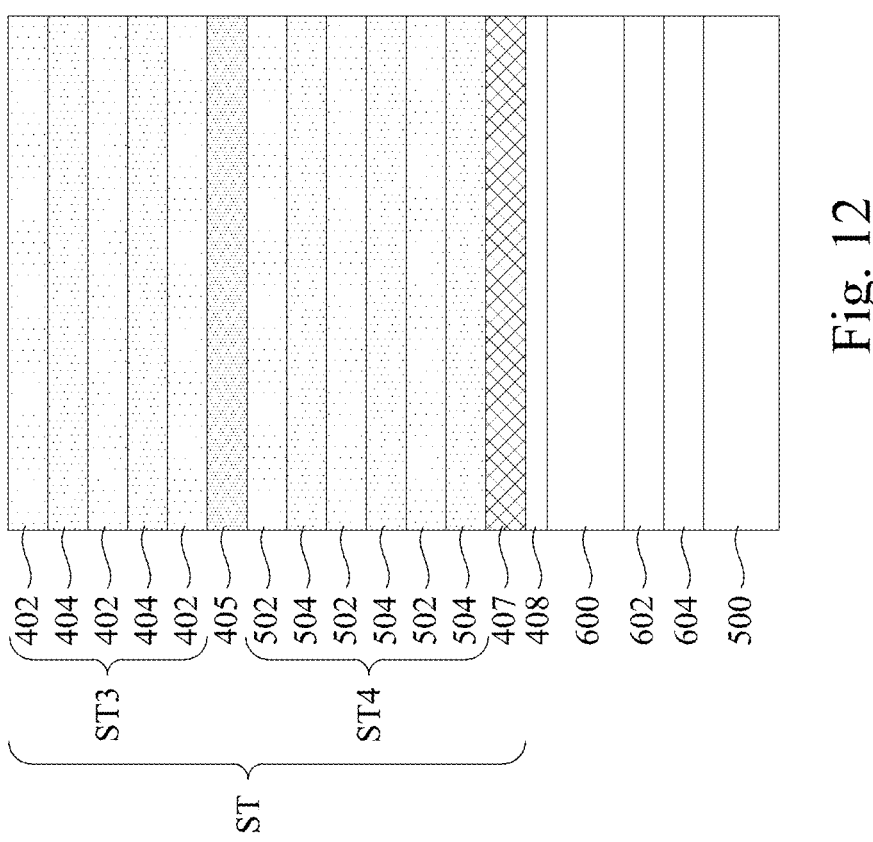

Reference is made to FIG. 12. A grinding process is performed on a backside of the substrate 400, so as to remove the substrate 400 until the topmost semiconductor layer 402 is exposed.

Figure 13B:
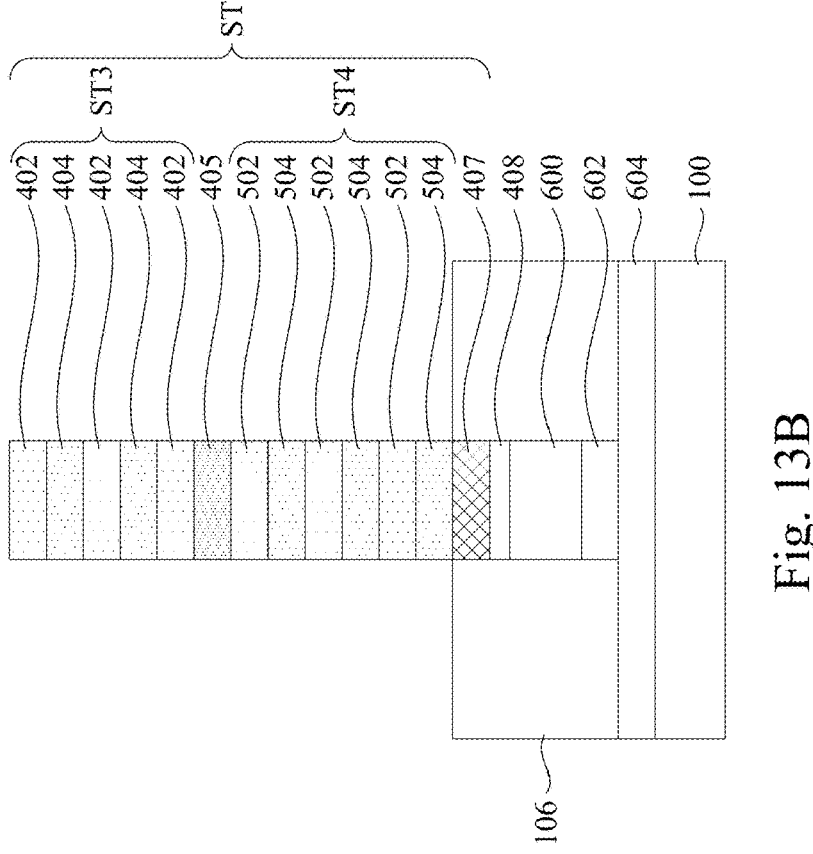
Figure 13A:
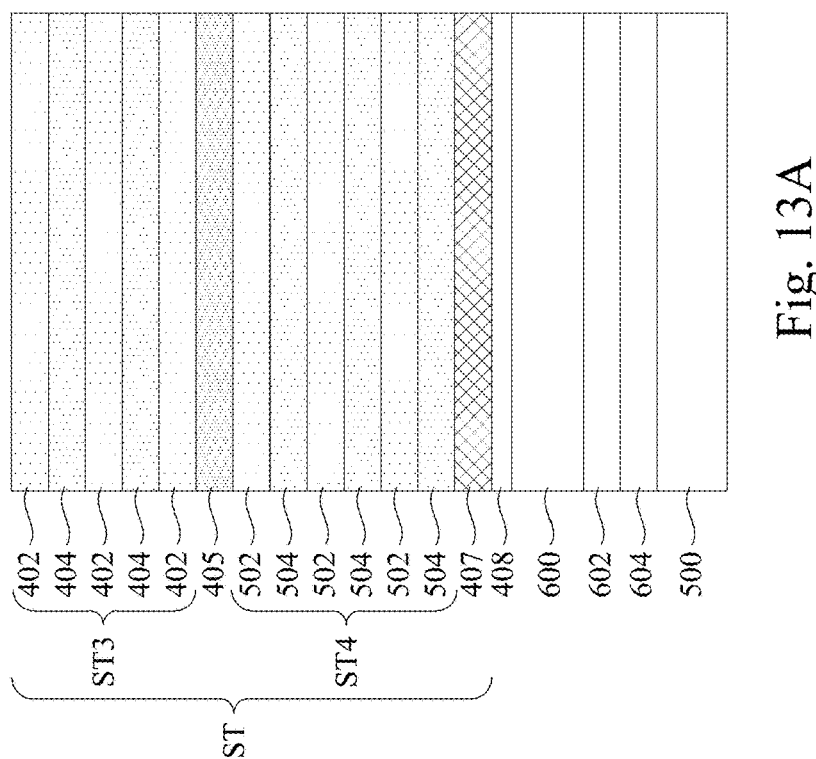

Reference is made to FIGS. 13A and 13B. A patterning process is performed to the stack ST, the high-kappa layer 407, the dielectric layer 408, the semiconductor layer 600, and the bonding layer 602 to form a fin structure. In some embodiments, the patterning process may include forming a patterned photoresist layer over the stack ST, and then performing an etching process to remove unwanted portions of the stack ST, the high-kappa layer 407, the dielectric layer 408, the semiconductor layer 600, and the bonding layer 602 exposed by the patterned photoresist layer. The fin structure may include remaining portions of the stack ST, the high-kappa layer 407, the dielectric layer 408, the semiconductor layer 600, and the bonding layer 602. In some embodiments, the etching process may include wet etch, dry etch, or the like.

After the fin structure is formed, isolation structures 106 are formed over the substrate 500 and laterally surrounding the fin structure. In some embodiments, the isolation structures 106 may be in contact with sidewalls of the high-kappa layer 407, the dielectric layer 408, the semiconductor layer 600, and the bonding layer 602.

Figure 14B:
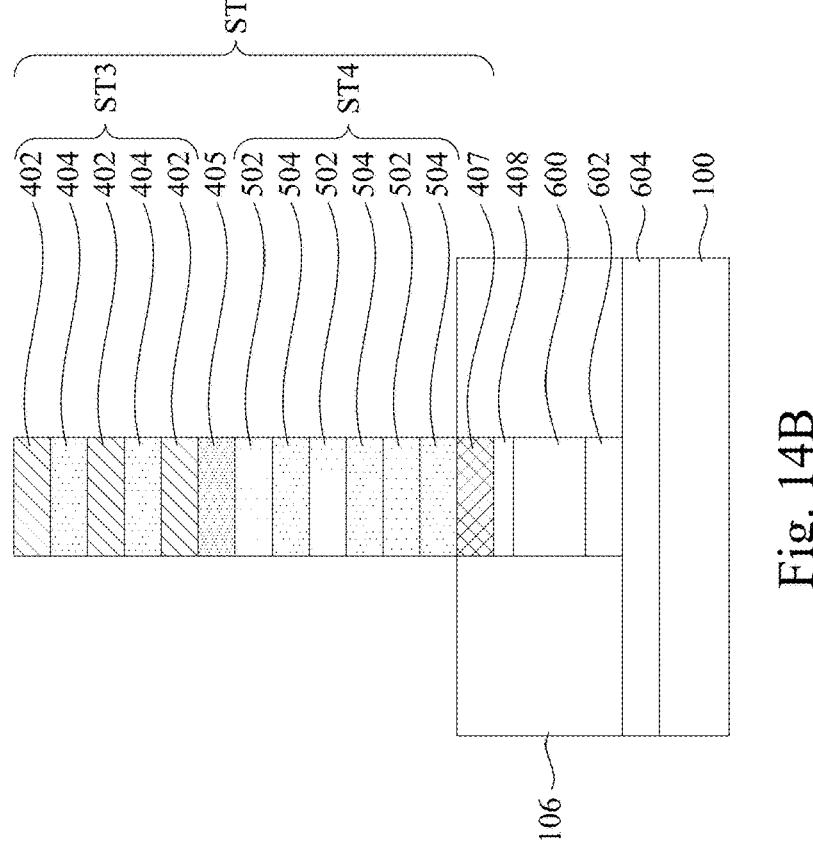
Figure 14A:
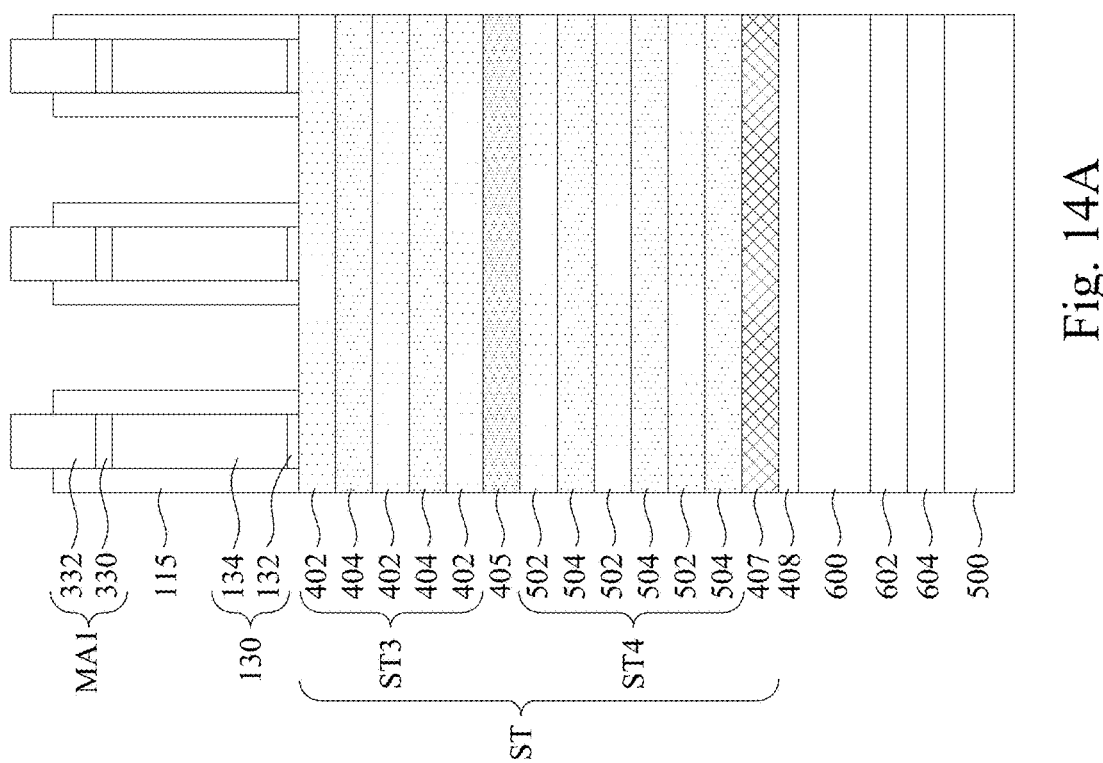

Reference is made to FIGS. 14A and 14B. Dummy gate structures 130 are formed over the substrate 100 and crossing the fin structure. In some embodiments, each of the dummy gate structures 130 includes a dummy gate dielectric 132 and a dummy gate electrode 134 over the dummy gate dielectric 132. In some embodiments, patterned masks MA1 are disposed over the dummy gate structures 130. Spacers 115 are formed on opposite sidewalls of each of the dummy gate structures 130.

Figures 15A, 15B:
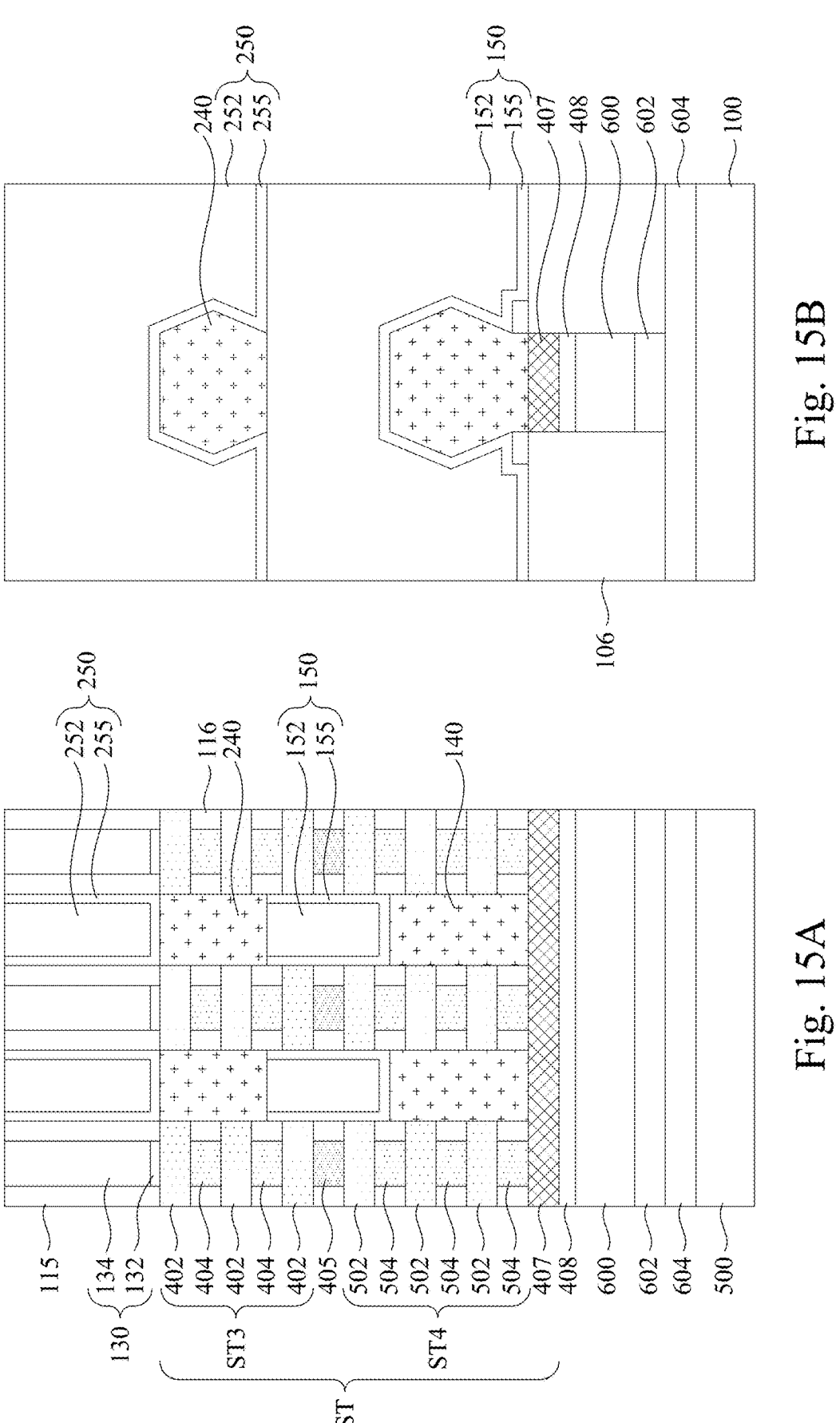

Reference is made to FIGS. 15A and 15B. An etching process is performed to remove portions of the fin structure (or stack ST) by using the dummy gate structures 130 and the spacers 115 as etch mask, so as to form source/drain openings in the fin structure (or in the stack ST). In some embodiments, the etching process may be wet etch, dry etch, or combinations thereof.

After the source/drain openings are formed, the semiconductor layers 404 and the semiconductor layers 504 are laterally etched to form sidewall recesses. Similarly, the semiconductor layer 405 is laterally etched to form sidewall recesses. Afterwards, inner spacers 116 are formed in the sidewall recesses on opposite ends of each of the semiconductor layers 404, the semiconductor layers 504, and the semiconductor layer 405.

First source/drain epitaxy structures 140 are formed on opposite ends of each of the semiconductor layers 502, respectively. A contact etch stop layer (CESL) 155 is formed covering the first source/drain epitaxy structures 140, and an interlayer dielectric (ILD) layer 152 is formed over the CESL 155. Second source/drain epitaxy structures 240 are formed on opposite ends of each of the semiconductor layers 402. A contact etch stop layer (CESL) 255 is formed covering the second source/drain epitaxy structures 240, and an interlayer dielectric (ILD) layer 252 is formed over the CESL 255. Then, a planarization process, such as CMP, is performed to remove excess materials of the CESL 255 and the ILD layer 252 until the dummy gate structures 130 are exposed. In some embodiments, the patterned masks MA1 are removed during the planarization process. In some embodiments, the CESL 255 and the ILD layer 252 can be collectively referred to as an isolation structure 250.

Figures 16A, 16B:
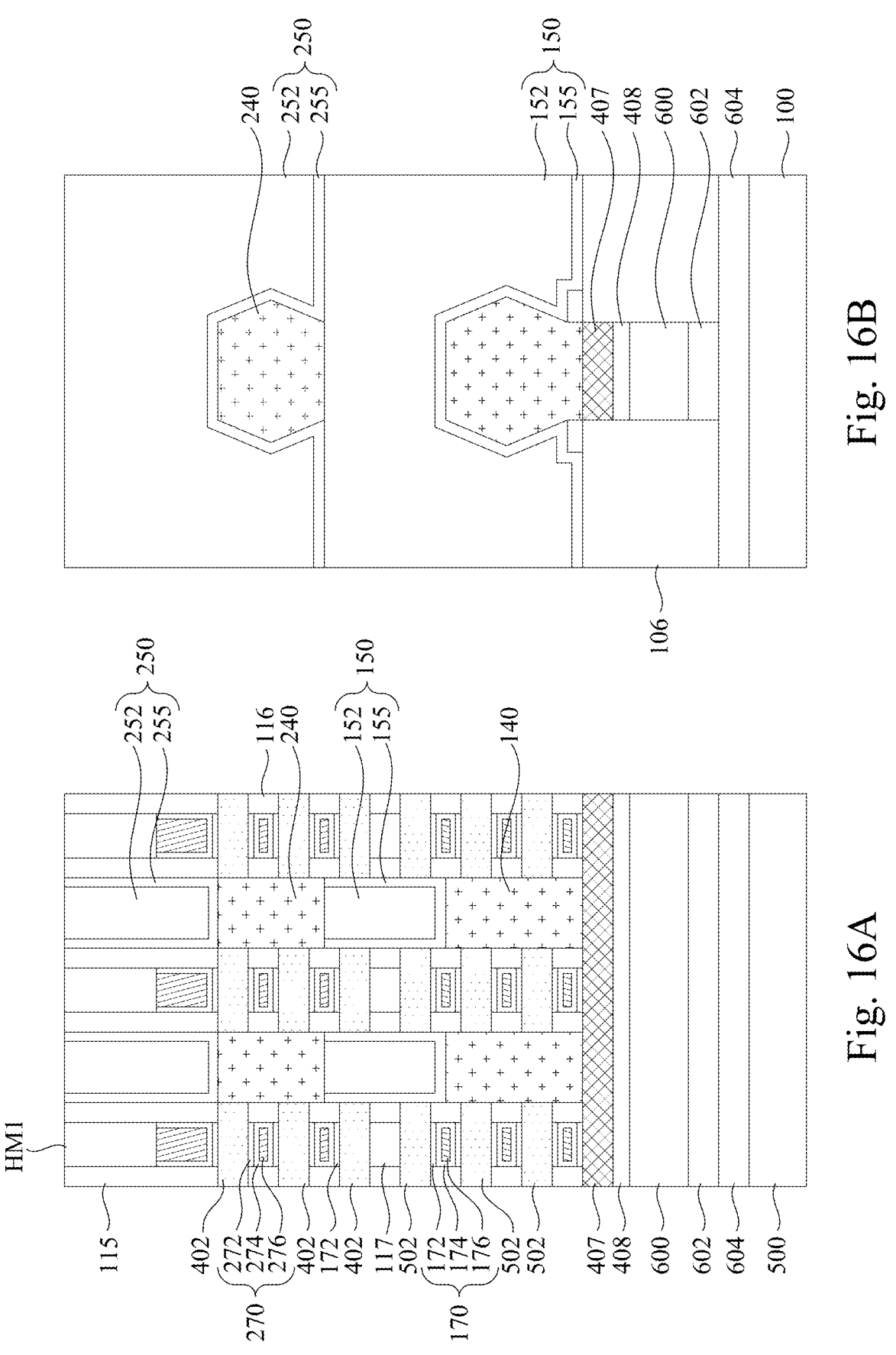

Reference is made to FIGS. 16A and 16B. The dummy gate structures 130 are removed to form gate trenches between each pair of the spacers 115. Then, the semiconductor layer 405 is replaced with an isolation layer 117. For example, an etching process is performed to remove the semiconductor layer 405 to form a gap vertically between the topmost semiconductor layer 502 and the bottommost semiconductor layer 402. As mentioned above, because the semiconductor layer 405 has a higher germanium concentration than the semiconductor layers 402, 404, 502, and 504, the etchant can be properly selected such that the semiconductor layer 405 is selectively removed, while keeping the semiconductor layers 402, 404, 502, and 504 substantially intact. Afterwards, isolation material is formed in the gate trench and filling the gap. An anisotropic etching process is performed to remove the isolation material outside the gap, and the remaining portion of the isolation material in the gap is referred to as the isolation layer 117. The material of the isolation layer 117 may be similar to the inner spacers 116, and thus relevant details will not be repeated for brevity.

Then, an etching process is performed to remove the semiconductor layers 404 and 504 through the gate trenches, such that that the semiconductor layers 402 and the semiconductor layers 502 are suspended over the substrate 100.

Gate structures 170 and gate structures 270 are therefore formed in the gate trenches. The formation method of the gate structures 170 and gate structures 270 are similar to those described above, and will not be repeated for brevity. Each of the first metal gate structures 170 includes the interfacial layer 172, the gate dielectric layer 174 over the interfacial layer 172, and the gate electrode 176 over the gate dielectric layer 174. Each of the second metal gate structures 270 includes the interfacial layer 272, the gate dielectric layer 274 over the interfacial layer 272, and the gate electrode 276 over the gate dielectric layer 274.

The second metal gate structures 270 are then etched back, such that top surfaces of the second metal gate structures 270 are lower than top surfaces of the gate spacers 115. Afterwards, hard masks HM1 are formed over the respectively second metal gate structures 270.

The first metal gate structure 170, the first source/drain epitaxy structures 140 on opposite sides of the first metal gate structure 170, and the semiconductor layers 502 that are in contact with the first source/drain epitaxy structures 140 may collectively serve as the first transistor TR1 as described in FIG. 1. In such condition, the semiconductor layers 502 that are in contact with the first source/drain epitaxy structures 140 may also be referred to as channel layers of the first transistor TR1. Similarly, the second metal gate structure 270, the second source/drain epitaxy structures 240 on opposite sides of the second metal gate structure 270, and the semiconductor layers 402 that are in contact with the second source/drain epitaxy structures 240 may collectively serve as the second transistor TR2 as described in FIG. 1. In such condition, the semiconductor layers 402 that are in contact with the second source/drain epitaxy structures 240 may also be referred to as channel layers of the second transistor TR2. In FIG. 16A, opposite ends of the topmost semiconductor layer 502 are in contact with the isolation structures 150, and are not in contact with the first source/drain epitaxy structures 140. Thus, the topmost semiconductor layer 502 may not function as a channel layer of the first transistor TR1. Similarly, opposite ends of the bottommost semiconductor layer 402 are in contact with the isolation structure 150, and are not in contact with the second source/drain epitaxy structures 240. Thus, the bottommost semiconductor layer 402 may not function as a channel layer of the second transistor TR2.

Figure 17:
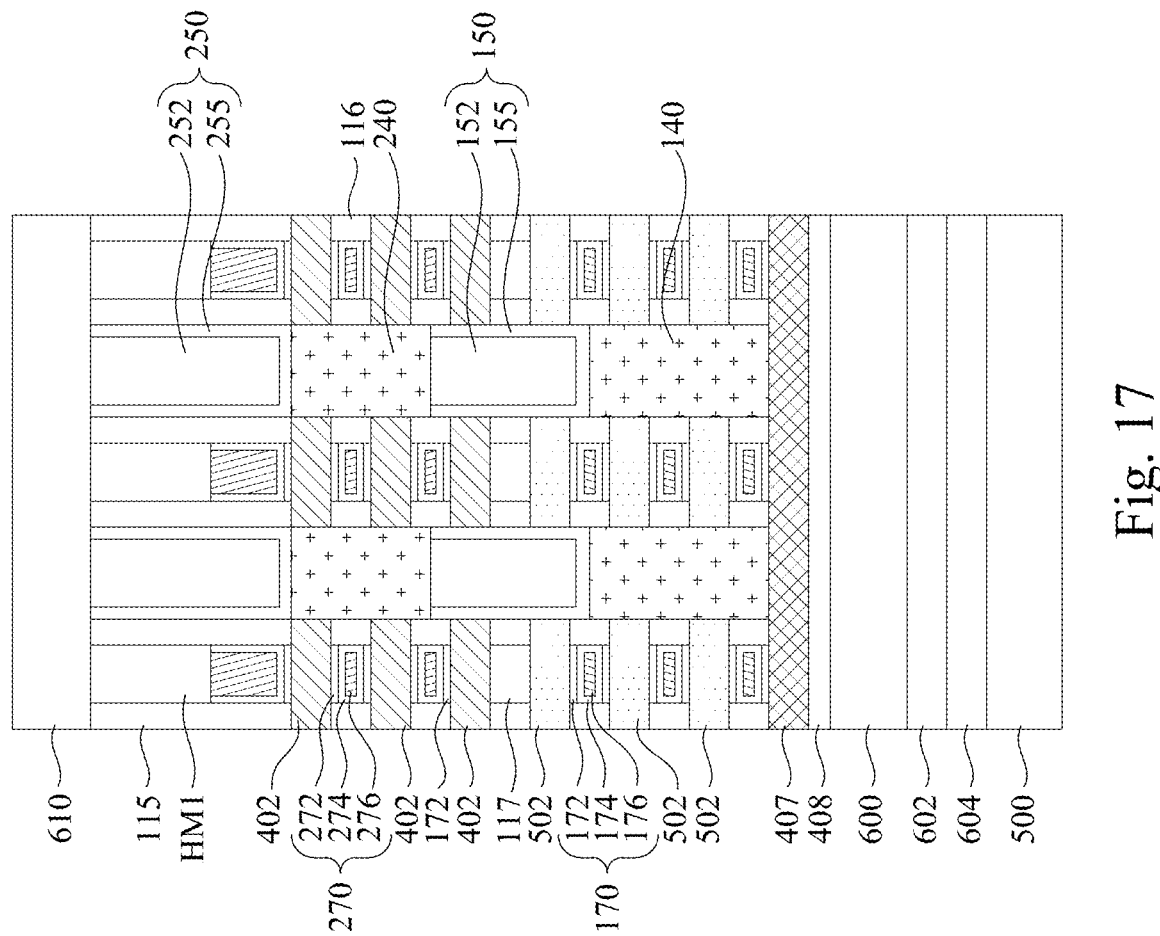

Reference is made to FIG. 17. An interconnection structure 610 is formed over the isolation structure 250. In some embodiments, the interconnection structure 610 may include one or more layers of dielectric layers and metal layers (not shown), in which the metal layers may be electrically connected to the underlying structures, such as the second metal gate structure 270, the second source/drain epitaxy structures 240, the first metal gate structure 170, and/or the first source/drain epitaxy structures 140.

Figure 18:
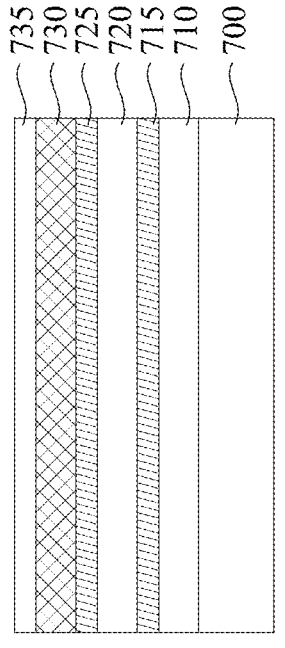
Figure 18:
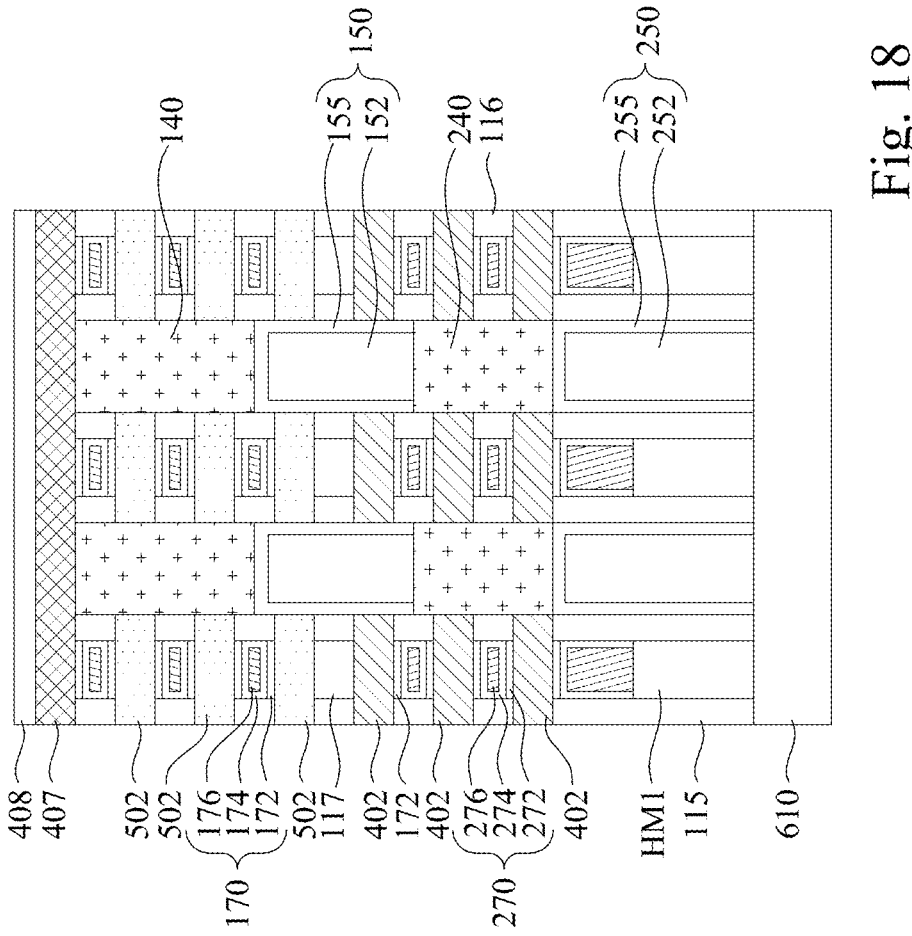

Reference is made to FIG. 18. The structure shown in FIG. 17 is flipped over by 180 degrees. Then, a grinding process is performed on a backside of the substrate 500 until the dielectric layer 408 is exposed. In some embodiments, the substrate 500, the bonding layers 602 and 604, and the semiconductor layer 600 are removed during the grinding process.

On the other hand, a substrate 700 is provided. A dielectric layer 710 is formed over the substrate 700. An etch stop layer 715 is formed over the dielectric layer 710. A dielectric layer 720 is formed over the etch stop layer 715. An etch stop layer 725 is formed over the dielectric layer 720. The etch stop layers 715 and 725 may be a dielectric layer including silicon nitride, silicon oxynitride or other suitable materials. In some embodiments, the dielectric layers 710 and 720 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric layers 710 and 720, and the etch stop layers 715 and 725 may be formed using, for example, CVD. ALD or other suitable techniques.

A high-kappa layer 730 is formed over the etch stop layers 725. Then, a dielectric layer 735 is formed over the high-kappa layer 730. The material of the high-kappa layer 730 may be similar to the material of the high-kappa layers 107 and 207 as discussed above, and thus relevant details will not be repeated for brevity. The material of the dielectric layer 735 may be similar to the material of the dielectric layers 108 and 208 as discussed above, and thus relevant details will not be repeated for brevity.

Figure 19:
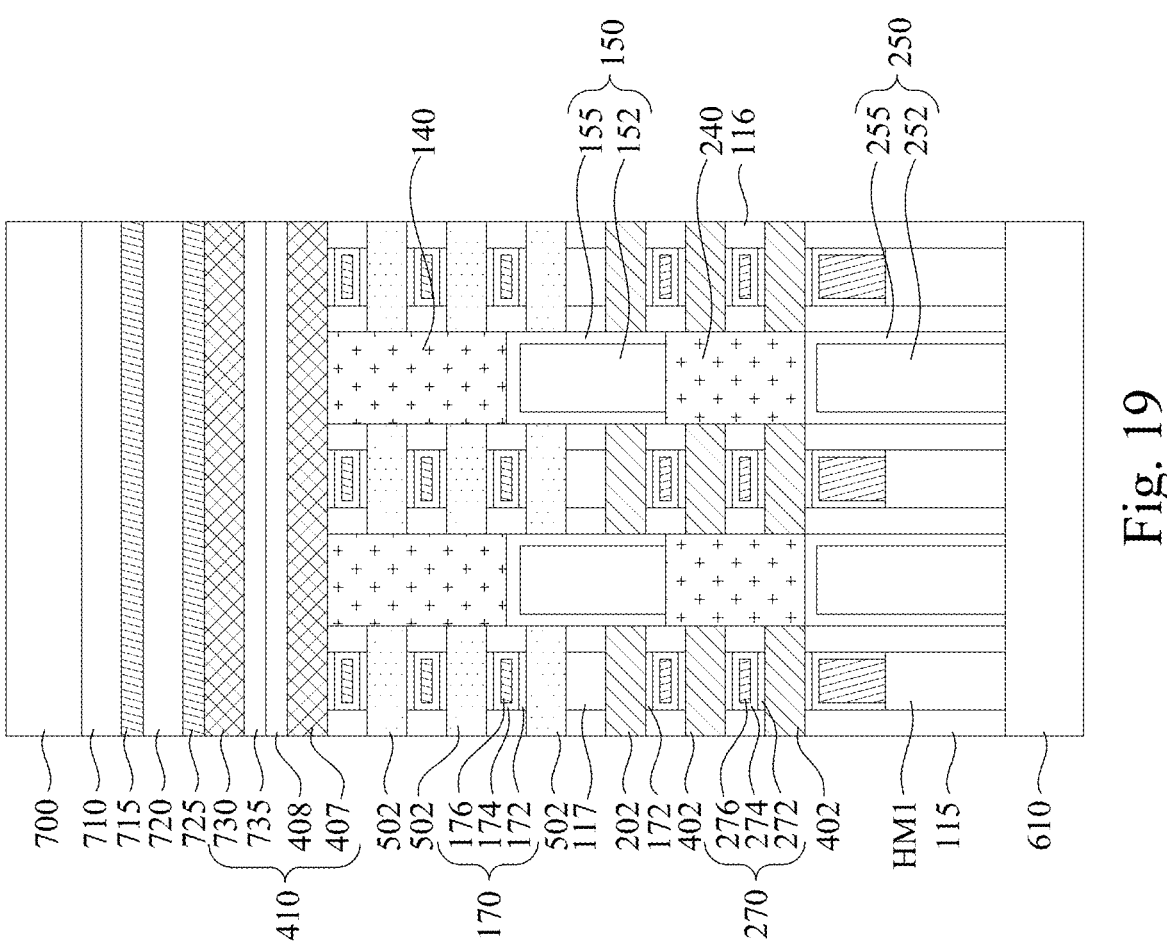

Reference is made to FIG. 19. The substrate 700 is flipped over by 180 degrees, such that the dielectric layer 735 on the substrate 700 faces the dielectric layer 408. Then, the dielectric layers 408 and 735 are bonded with each other using a suitable technique. The bonding process of the dielectric layers 408 and 735 may be similar to the bonding process of the dielectric layers 108 and 208 as described above with respect to FIG. 3, and thus relevant details will not be repeated for brevity. After the bonding process is completed, the high-kappa layers 407 and 730, and the dielectric layers 408 and 735 may be collectively referred to as a heat dissipation multilayer 410. Each of the high-kappa layers 407 and 730 can be referred to as a heat dissipation layer. In some embodiments, the dielectric layers 408 and 735 may be collectively referred to as a dielectric layer.

Figure 20:
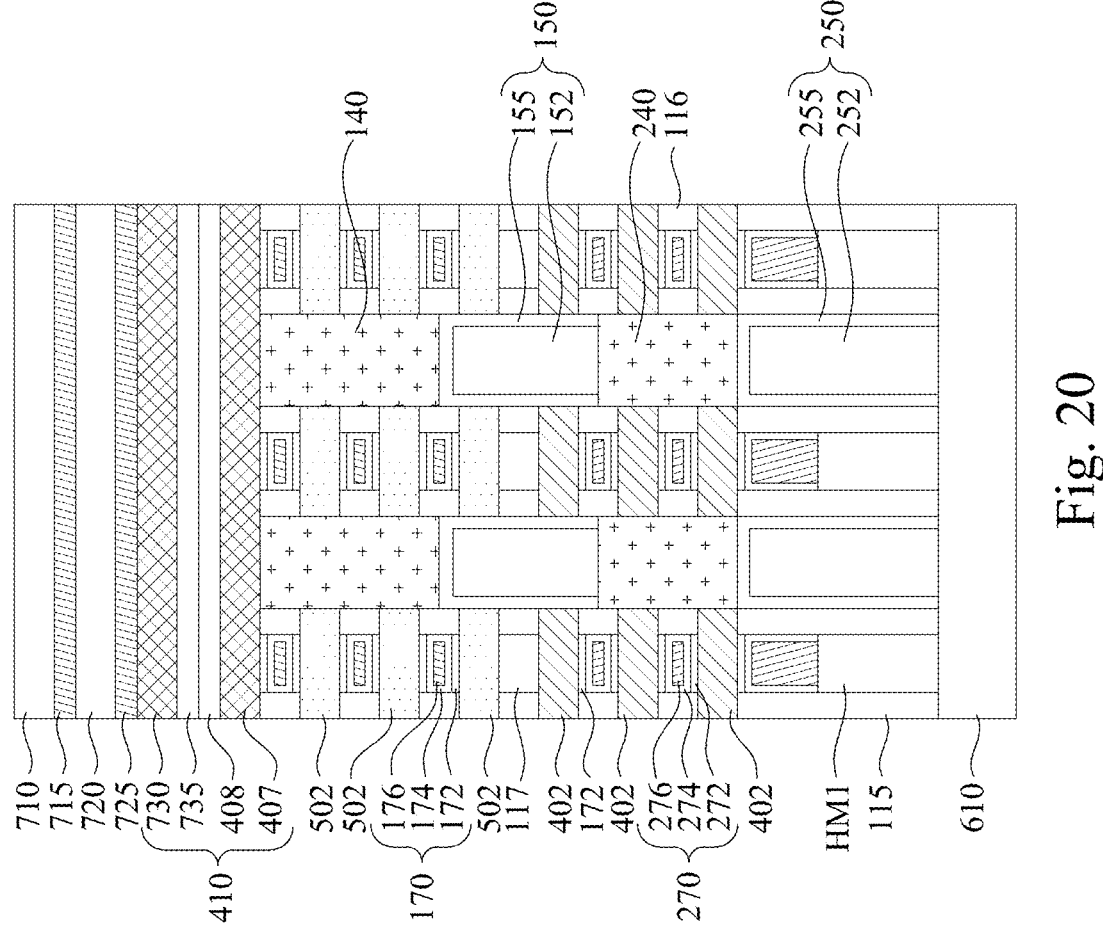

Reference is made to FIG. 20. A grinding process is performed on a backside of the substrate 700 until the dielectric layer 710 is exposed. In some embodiments, the substrate 700 is removed during the grinding process.

In some embodiments of the present disclosure, a heat dissipation multilayer 410, which includes a high-kappa layer 407 and a high-kappa layer 730, is integrated in a CFET structure. In greater detail, the heat dissipation multilayer 410 is formed between the CFET structure and the backside interconnection structure 620, which is beneficial for the heat dissipation between the CFET structure and the backside interconnection structure 620. In some embodiments where the high-kappa layers 407 and 730 are made of different high-kappa materials, if the high-kappa layers 407 and 730 are in contact with each other, the high-kappa layers 407 and 730 may suffer from high thermal boundary resistance at the interface due to phonon frequency mismatch. As a result, dielectric layers 408 and 735 are inserted between the high-kappa layers 407 and 730. The dielectric layers 408 and 735 may allow phonon transmission between the high-kappa layers 407 and 730 without frequency mismatch issue. Therefore, the heat dissipation between the high-kappa layers 407 and 730, as well as the heat dissipation between the CFET structure and the backside interconnection structure 620, may be improved. Detailed mechanism has been discussed above with respect to FIGS. 21A to 22B, and thus relevant details will not be repeated for brevity.

Moreover, with respect to the processes from FIGS. 10 to 20, the semiconductor layer 600 can act as a heat sink for heat dissipation during the manufacturing process. Because the semiconductor layer 600 and the high-kappa layer 407 are also made of crystalline structures, heat dissipation issue may also occur at the interface between the semiconductor layer 600 and the high-kappa layer 407. Accordingly, the dielectric layer 408 can also act as a bridging layer between the semiconductor layer 600 and the high-kappa layer 407 to reduce the thermal boundary resistance between the semiconductor layer 600 and the high-kappa layer 407. As a result, heat dissipation from the high-kappa layer 407 to the semiconductor layer 600 may also be improved.

Figure 23:
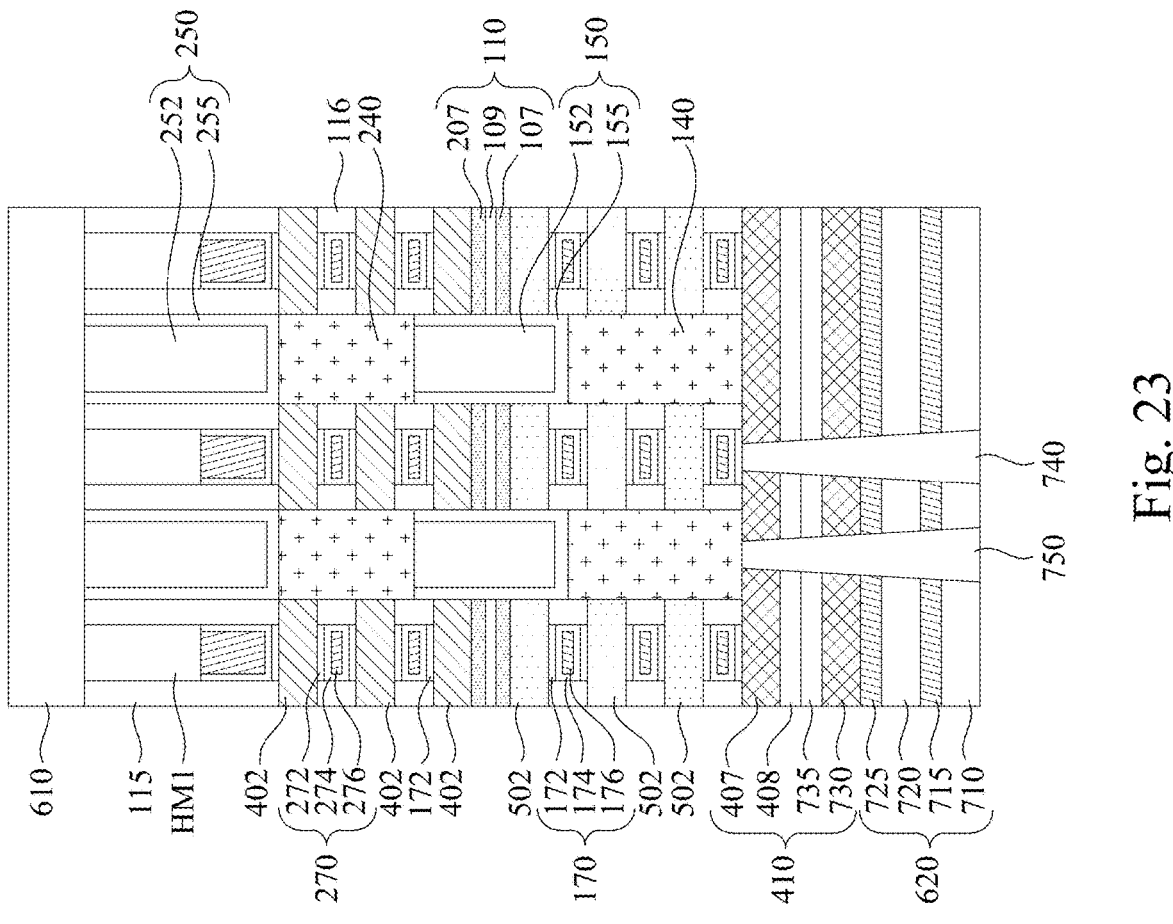
FIG. 23 is a cross-sectional view of a semiconductor device in accordance with some embodiments of the present disclosure.

FIG. 23 is a cross-sectional view of a semiconductor device in accordance with some embodiments of the present disclosure. It is noted that some elements of FIG. 23 may be similar to those described above, such elements will labeled the same, and relevant details will not be repeated for brevity. FIG. 23 is similar to the structures shown in FIG. 9 and FIG. 19, in which the structure of FIG. 23 includes both the heat dissipation multilayer 110 and the heat dissipation multilayer 410.

Moreover, the structure of FIG. 23 also includes conductive vias 740 and 750 formed through the dielectric layer 710, the etch stop layer 715, the dielectric layer 720, the etch stop layer 725, and the heat dissipation multilayer 410, such that the conductive vias 740 and 750 are in contact with the first metal gate structure 170 and the first source/drain epitaxy structure 140 of the first transistor (e.g., first transistor TR1), respectively. The conductive vias 740 and 750 may also be referred to as backside vias. In some embodiments, the conductive vias 740 and 750 may include TiN. TiAl, Mo, Ru, W, or other suitable conductive materials. In some embodiments, the conductive vias 740 and 750 may also be present in the structure of FIG. 20.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. Embodiments of the present disclosure provide a CFET, which include a heat dissipation multilayer. The heat dissipation multilayer may include a first high-kappa layer and a second high-kappa layer. The heat dissipation multilayer may also include a dielectric layer between the first high-kappa layer and the second high-kappa layer. The dielectric layer may act as a bridging layer between the first high-kappa layer and the second high-kappa layer, so as to reduce the thermal boundary resistance between the first high-kappa layer and the second high-kappa layer. Accordingly, the heat dissipation of the device may be improved.

In some embodiments of the present disclosure, a semiconductor device includes first transistor, a second transistor above the first transistor, and a heat dissipation multilayer between the first transistor and the second transistor. The first transistor includes a first semiconductor layer, a first gate structure wrapping around the first semiconductor layer, and first source/drain epitaxy structures on opposite ends of the first semiconductor layer. The second transistor includes a second semiconductor layer, a second gate structure wrapping around the second semiconductor layer, and second source/drain epitaxy structures on opposite ends of the second semiconductor layer. The heat dissipation multilayer is between the first transistor and the second transistor, wherein the heat dissipation multilayer comprises a first layer having a first phonon frequency range, a second layer having a second phonon frequency range, and a third layer between the first layer and the second layer, and wherein the third layer has a third phonon frequency range overlapping the first phonon frequency range and the second phonon frequency range.

In some embodiments, thermal conductivities of the first and second layers are higher than a thermal conductivity of the third layer.

In some embodiments, the first layer and the second layer include crystalline structures, while the third layer includes amorphous structure.

In some embodiments, the first and second layers are made of different materials.

In some embodiments, the first and second layers are separated apart by the third layer.

In some embodiments, the semiconductor device further includes inner spacers on opposite ends of the heat dissipation multilayer.

In some embodiments, the semiconductor device further includes an isolation structure in contact with one of the first source/drain epitaxy structures and one of the second source/drain epitaxy structures, in which the heat dissipation multilayer is in contact with the isolation structure.

In some embodiments of the present disclosure, a semiconductor device includes first transistor, a second transistor on a front side of the first transistor, a backside interconnect structure on a backside of the first transistor, and a heat dissipation multilayer between the backside interconnect structure and the first transistor. The first transistor includes a first semiconductor layer, a first gate structure wrapping around the first semiconductor layer, and first source/drain epitaxy structures on opposite ends of the first semiconductor layer. The second transistor includes a second semiconductor layer, a second gate structure wrapping around the second semiconductor layer, and second source/drain epitaxy structures on opposite ends of the second semiconductor layer. The heat dissipation multilayer includes a first heat dissipation layer, a second heat dissipation layer, and a dielectric layer between the first heat dissipation layer and the second heat dissipation layer, in which thermal conductivities of the first and second heat dissipation layers are higher than a thermal conductivity of the dielectric layer.

In some embodiments, the backside interconnect structure comprises a backside via, and the backside via extends into the heat dissipation multilayer and electrically connected to the first transistor.

In some embodiments, the heat dissipation multilayer is in contact with the first gate structure.

In some embodiments, the heat dissipation multilayer is in contact with one of first source/drain epitaxy structure.

In some embodiments, the first and second heat dissipation layers comprise aluminum nitride or boron nitride.

In some embodiments, the first and second heat dissipation layers comprise yttrium oxide, yttrium aluminum garnet, aluminum oxide, or beryllium oxide.

In some embodiments, the first and second heat dissipation layers comprise silicon carbide, graphene, diamond-like, or diamond.

In some embodiments, the first and second heat dissipation layers are made of different materials.

In some embodiments of the present disclosure, a method includes forming a first stack of alternating first semiconductor channel layers and first sacrificial layers and a second stack of alternating second semiconductor channel layers and second sacrificial layers over a first substrate; forming a first heat dissipation layer over the second stack of alternating second semiconductor channel layers and second sacrificial layers, the first heat dissipation layer has a first range of phonon frequency; forming a first dielectric layer over the first heat dissipation layer; forming first source/drain epitaxy structures on opposite ends of each of the first semiconductor channel layers; forming second source/drain epitaxy structures on opposite ends of each of the second semiconductor channel layers; replacing the first sacrificial layers with a first gate structure, the first gate structure wrapping around each of the first semiconductor channel layers; replacing the second sacrificial layers with a second gate structure, the second gate structure wrapping around each of the second semiconductor channel layers; bonding the first dielectric layer with a second heat dissipation layer by using a second dielectric layer, wherein the second heat dissipation layer has a second range of phonon frequency distinct from the first range of phonon frequency; and forming a backside via extending through the first heat dissipation layer, the first dielectric layer, the second dielectric layer, and the second heat dissipation layer.

In some embodiments, the method further includes prior to forming the second dielectric layer over the second heat dissipation layer, forming the second heat dissipation layer over a second substrate; and prior to forming the backside via, performing a grinding process on a backside of the second substrate to remove the second substrate.

In some embodiments, the method further includes forming a dielectric material over the second substrate prior to forming the second heat dissipation layer, wherein the backside via is formed in the dielectric material.

In some embodiments, thermal conductivities of the first and second heat dissipation layers are higher than thermal conductivities of the first and second dielectric layers.

In some embodiments, the method further includes forming a semiconductor layer over the first dielectric layer; forming a first bonding layer over the semiconductor layer; forming a second bonding layer over a second substrate; bonding the first bonding layer with the second bonding layer; and prior to bonding the first dielectric layer with the second dielectric layer, performing a grinding process on a backside of the second substrate until the first dielectric layer is exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first transistor, comprising:
a first semiconductor layer;
a first gate structure wrapping around the first semiconductor layer; and
first source/drain epitaxy structures on opposite ends of the first semiconductor layer;
a second transistor above the first transistor, comprising:
a second semiconductor layer;
a second gate structure wrapping around the second semiconductor layer; and
second source/drain epitaxy structures on opposite ends of the second semiconductor layer; and
a heat dissipation multilayer between the first transistor and the second transistor, wherein the heat dissipation multilayer comprises a first layer having a first phonon frequency range, a second layer having a second phonon frequency range, and a third layer between the first layer and the second layer, and wherein the third layer has a third phonon frequency range overlapping the first phonon frequency range and the second phonon frequency range.

2. The semiconductor device of claim 1, wherein thermal conductivities of the first and second layers are higher than a thermal conductivity of the third layer.

3. The semiconductor device of claim 1, wherein the first layer and the second layer include crystalline structures, while the third layer includes amorphous structure.

4. The semiconductor device of claim 1, wherein the first and second layers are made of different materials.

5. The semiconductor device of claim 1, wherein the first and second layers are separated apart by the third layer.

6. The semiconductor device of claim 1, further comprising inner spacers on opposite ends of the heat dissipation multilayer.

7. The semiconductor device of claim 1, further comprising an isolation structure in contact with one of the first source/drain epitaxy structures and one of the second source/drain epitaxy structures, wherein the heat dissipation multilayer is in contact with the isolation structure.

8. A semiconductor device, comprising:
a first transistor, comprising:
a first semiconductor layer;
a first gate structure wrapping around the first semiconductor layer; and
first source/drain epitaxy structures on opposite ends of the first semiconductor layer;
a second transistor on a front side of the first transistor, comprising:
a second semiconductor layer;

20 a second gate structure wrapping around the second semiconductor layer; and
second source/drain epitaxy structures on opposite ends of the second semiconductor layer;
a backside interconnect structure on a backside of the first transistor; and
a heat dissipation multilayer between the backside interconnect structure and the first transistor, wherein the heat dissipation multilayer comprises a first heat dissipation layer, a second heat dissipation layer, and a dielectric layer between the first heat dissipation layer and the second heat dissipation layer, and wherein thermal conductivities of the first and second heat dissipation layers are higher than a thermal conductivity of the dielectric layer.

9. The semiconductor device of claim 8, wherein the backside interconnect structure comprises a backside via, and the backside via extends into the heat dissipation multilayer and electrically connected to the first transistor.

10. The semiconductor device of claim 8, wherein the heat dissipation multilayer is in contact with the first gate structure.

11. The semiconductor device of claim 8, wherein the heat dissipation multilayer is in contact with one of first source/drain epitaxy structure.

12. The semiconductor device of claim 8, wherein the first and second heat dissipation layers comprise aluminum nitride or boron nitride.

13. The semiconductor device of claim 8, wherein the first and second heat dissipation layers comprise yttrium oxide, yttrium aluminum garnet, aluminum oxide, or beryllium oxide.

14. The semiconductor device of claim 8, wherein the first and second heat dissipation layers comprise silicon carbide, graphene, diamond-like, or diamond.

15. The semiconductor device of claim 8, wherein the first and second heat dissipation layers are made of different materials.

16. A method, comprising:
forming a first stack of alternating first semiconductor channel layers and first sacrificial layers and a second stack of alternating second semiconductor channel layers and second sacrificial layers over a first substrate;
forming a first heat dissipation layer over the second stack of alternating second semiconductor channel layers and second sacrificial layers, the first heat dissipation layer has a first range of phonon frequency;
forming a first dielectric layer over the first heat dissipation layer;
forming first source/drain epitaxy structures on opposite ends of each of the first semiconductor channel layers;
forming second source/drain epitaxy structures on opposite ends of each of the second semiconductor channel layers;
replacing the first sacrificial layers with a first gate structure, the first gate structure wrapping around each of the first semiconductor channel layers;
replacing the second sacrificial layers with a second gate structure, the second gate structure wrapping around each of the second semiconductor channel layers;
bonding the first dielectric layer with a second heat dissipation layer by using a second dielectric layer, wherein the second heat dissipation layer has a second range of phonon frequency distinct from the first range of phonon frequency; and forming a backside via extending through the first heat dissipation layer, the first dielectric layer, the second dielectric layer, and the second heat dissipation layer.

17. The method of claim 16, further comprising:

prior to forming the second dielectric layer over the second heat dissipation layer, forming the second heat dissipation layer over a second substrate; and prior to forming the backside via, performing a grinding process on a backside of the second substrate to remove the second substrate.

18. The method of claim 17, further comprising forming a dielectric material over the second substrate prior to forming the second heat dissipation layer, wherein the backside via is formed in the dielectric material.

19. The method of claim 16, wherein thermal conductivities of the first and second heat dissipation layers are higher than thermal conductivities of the first and second dielectric layers.

20. The method of claim 16, further comprising:

forming a semiconductor layer over the first dielectric layer;

forming a first bonding layer over the semiconductor layer;

forming a second bonding layer over a second substrate;

bonding the first bonding layer with the second bonding layer; and prior to bonding the first dielectric layer with the second dielectric layer, performing a grinding process on a backside of the second substrate until the first dielectric layer is exposed.

* * * * *